(12) United States Patent
Hertzberg et al.

(10) Patent No.: US 8,335,326 B2
(45) Date of Patent: Dec. 18, 2012

(54) COMMUNICATION METHOD FOR VACUUM TUBE REPLACEMENT DEVICES

(76) Inventors: Brett A. Hertzberg, Bellevue, WA (US); Douglas H. Roberts, Bellevue, WA (US)

( * ) Notice: Subject to any disclaimer, the term of this patent is extended or adjusted under 35 U.S.C. 154(b) by 1397 days.

(21) Appl. No.: 11/876,720

(22) Filed: Oct. 22, 2007

(65) Prior Publication Data

US 2008/0260183 A1    Oct. 23, 2008

Related U.S. Application Data

(63) Continuation-in-part of application No. 11/836,674, filed on Aug. 9, 2007, now Pat. No. 7,482,863, and a continuation-in-part of application No. 11/678,562, filed on Feb. 23, 2007, now Pat. No. 7,408,401, application No. 11/836,674, which is a continuation-in-part of application No. 11/203,077, filed on Aug. 12, 2005, now Pat. No. 7,286,060.

(51) Int. Cl.
*H03F 99/00* (2009.01)

(52) U.S. Cl. .............. 381/120; 381/119; 330/3; 330/49

(58) Field of Classification Search .......... 381/1–23, 381/119, 120; 330/3, 4, 6, 41–44, 49, 10; 324/118; 332/106–110, 115, 149–182, 117–120; 375/238

See application file for complete search history.

(56) References Cited

U.S. PATENT DOCUMENTS

| | | | | |
|---|---|---|---|---|
| RE31,523 E | * | 2/1984 | Baker ........................... | 455/76 |
| 4,994,757 A | * | 2/1991 | Bickley et al. ................ | 330/285 |
| 5,023,783 A | * | 6/1991 | Cohen et al. .................. | 600/559 |
| 5,461,347 A | * | 10/1995 | Cairns ........................... | 332/119 |
| 5,805,713 A | * | 9/1998 | Pritchard ........................ | 381/61 |
| 5,859,876 A | * | 1/1999 | Dapper et al. ................. | 375/295 |
| 6,985,749 B2 | * | 1/2006 | Bannasch et al. ............. | 455/506 |
| 7,551,025 B2 | * | 6/2009 | Margolis ....................... | 330/133 |
| 2006/0153390 A1 | * | 7/2006 | Iwaki et al. ..................... | 381/13 |

* cited by examiner

*Primary Examiner* — Vivian Chin
*Assistant Examiner* — Fatimat O Olaniran

(57) ABSTRACT

Methods are provided for solid-state implementation of a vacuum tube replacement device (VTRD) that includes a communication interface. The communication interface enables the VTRD to command or retrieve information regarding VTRD performance, function, and status. A VTRD may communicate with other VTRDs in a target amplifier retrofitted with compatible VTRDs and to an external user interface for programming or query/response. The methods presented for the vacuum tube replacement device system(s) are equally useful for non-vacuum tube systems such as audio amplifier circuits.

24 Claims, 17 Drawing Sheets

COMMUNICATION METHOD FOR VACUUM TUBE REPLACEMENT DEVICES

RELATED APPLICATIONS

This utility patent application claims the benefit under 35 U.S.C. §120 as a continuation-in-part of U.S. patent application Ser. No. 11/836,674, titled "EXPANDED PERFORMANCE AND FUNCTIONS FOR VACUUM TUBE REPLACEMENT DEVICES", which was filed Aug. 9, 2007, U.S. patent application Ser. No. 11/678,562, titled "VACUUM TUBE REPLACEMENT DEVICE, CIRCUIT AND SYSTEM", which was filed Feb. 23, 2007, and U.S. patent application Ser. No. 11/203,077, titled "INDICATORS FOR VACUUM TUBE REPLACEMENT DEVICES", and which was filed Aug. 12, 2005, all of which are hereby incorporated by reference in their entirety.

FIELD OF THE INVENTION

The present disclosure generally relates to solid state systems, circuits, and devices that may be used to replace vacuum tubes, such as pin-for-pin compatible devices. Such devices may be employed in audio amplifiers including guitar/musical instrument amplifiers, hi-fi amplifiers, and any application circuit that may benefit from such replacement devices.

BACKGROUND

Glass vacuum tubes have been widely used in audio applications such as amplification of musical instruments as well as hi-fidelity reproduction. Although solid-state circuit technology has also been developed for use in such audio applications, traditional glass-envelope vacuum tubes are still being used in some audio applications. Modern audio applications often use glass vacuum tubes for their acoustic properties, as well as their esthetic appeal.

Solid-state technology has been acknowledged for cost, performance, manufacturability, and/or other advantages over glass vacuum tubes. Solid-state devices can be significantly less expensive to manufacture, smaller in size, less prone to mechanical failures and wear-out anomalies as compared to glass vacuum tubes. Some solid-state systems and implementations have been developed to emulate the overall functional operation of a glass vacuum tube.

Direct pin-for-pin compatible vacuum tube replacement devices (VTRDs) have also been developed such as is described by the present author in U.S. patent application Ser. No. 11/678,562, titled "VACUUM TUBE REPLACEMENT DEVICE, CIRCUIT AND SYSTEM". The present disclosure describes solid-state circuits that can be incorporated into VTRDs that enables inaudible signal communication between VTRDs in a target amplification system and further communication to external user interface systems. As will be further described, the present disclosure contemplates applying the described system, circuits and devices in other non-vacuum tube replacement applications.

BRIEF DESCRIPTION OF THE DRAWINGS

Non-limiting and non-exhaustive embodiments are described with reference to the following drawings.

DETAILED DESCRIPTION

Figure 1:
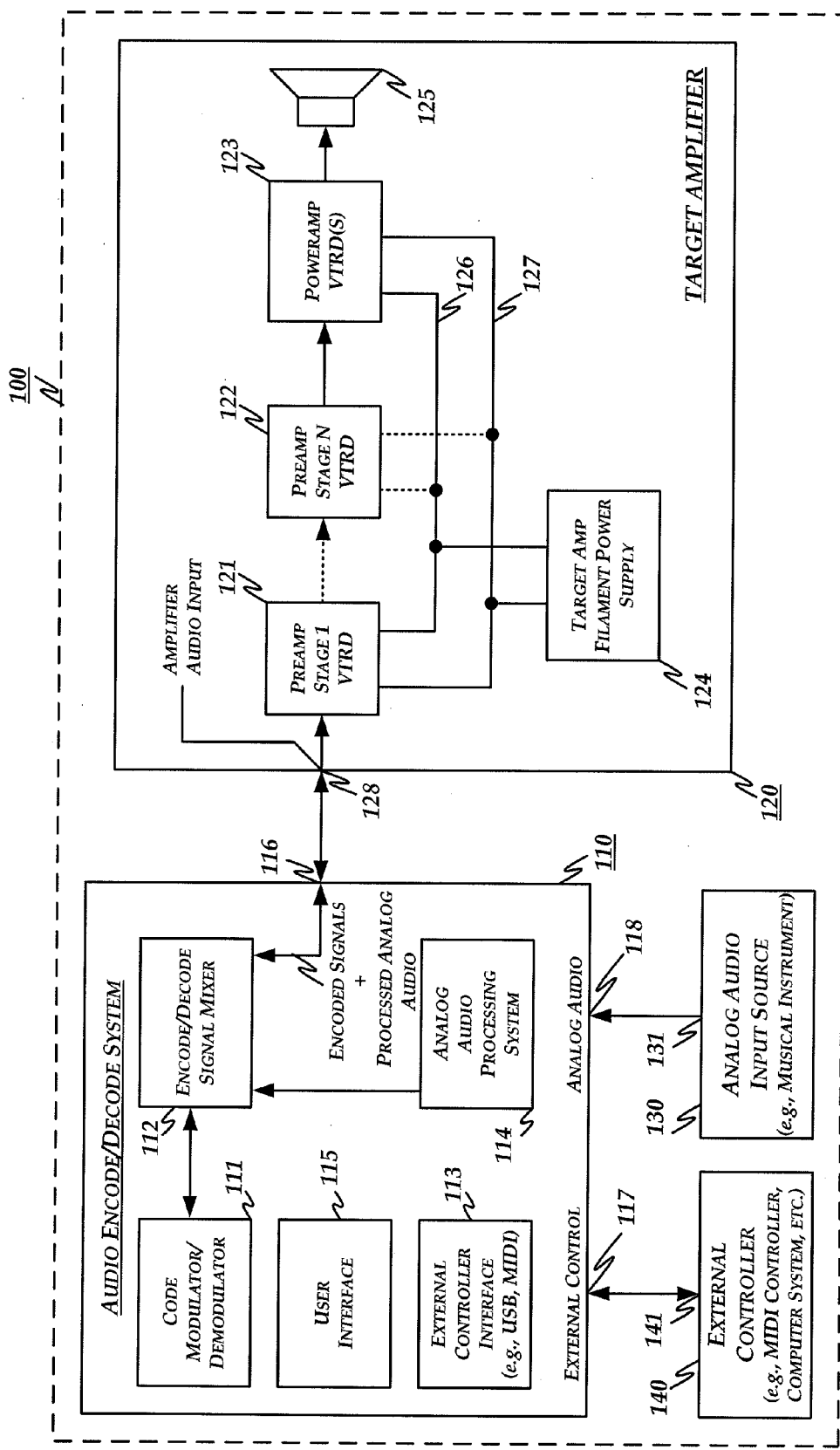
FIG. 1 is a block diagram illustrating an example arrangement of a target amplifier employing communication compatible VTRDs and an audio encode/decode system employed as an external user/communication interface.

Various embodiments will be described in detail with reference to the drawings, where like reference numerals represent like parts and assemblies throughout the several views. Reference to various embodiments does not limit the scope of the present disclosure, which is limited only by the scope of the claims attached hereto.

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. The meaning of "in" may include "in" and "on." The term "connected" may mean a direct electrical, electro-magnetic, mechanical, logical, or other connection between the items connected, without any electrical, mechanical, logical or other intermediary there between. The term "coupled" can mean a direct connection between items, an indirect connection through one or more intermediaries, or communication between items in a manner that may not constitute a connection. The term "circuit" can mean a single component or a plurality of components, active and/or passive, discrete or integrated, that are coupled together to provide a desired function. The term "signal" can mean at least one current, voltage, charge, data, or other such identifiable quantity. Additionally, any examples set forth in this specification are not intended to be limiting and merely set forth some of the many possible embodiments for the claimed invention.

Briefly stated, the present disclosure generally relates to a communication system, apparatus and method for interfacing with a solid-state vacuum tube replacement device (VTRD) that is placed inside of a target amplifier. The VTRD emulates the operation of an electron vacuum tube and also includes the capability of sending or receiving information to other VTRDs in the target amplifier. The described communication methods utilize the target amplifiers existing internal filament supply wires as a communication path. In addition, VTRD information (e.g., settings, commands, data, etc.) may be sent to or read from the target amplifier via an external user interface without modifying the target amplifier by coding inaudible command/data information and mixing the coded information with the target amplifiers audio input signal. The target amplifiers input path connector (e.g. ¼" audio input jack) function as both the external communication port and the audio input port without compromising the audio signal.

The described communication system can be utilized to facilitate real-time programming of VTRD functions. Such functions may not be otherwise possible in the target amplifier without having to make wiring and/or circuit modifications to the amplifier itself. One example function may be to selectively boost the signal gain in one stage of the target amplifier. When this example function does not exist in the target amplifier, circuit modification would normally be required to retrofit the function into the target amplifier. Through use of a VTRD that is arranged in accordance with the presently described communication methods, the increased signal gain function can be realized without modifying any of the existing circuits. Examples of additional VTRD functions are described in U.S. patent application Ser. No. 11/836,674, titled "EXPANDED PERFORMANCE AND FUNCTIONS FOR VACUUM TUBE REPLACEMENT DEVICES", filed Aug. 9, 2007.

Figure 12:
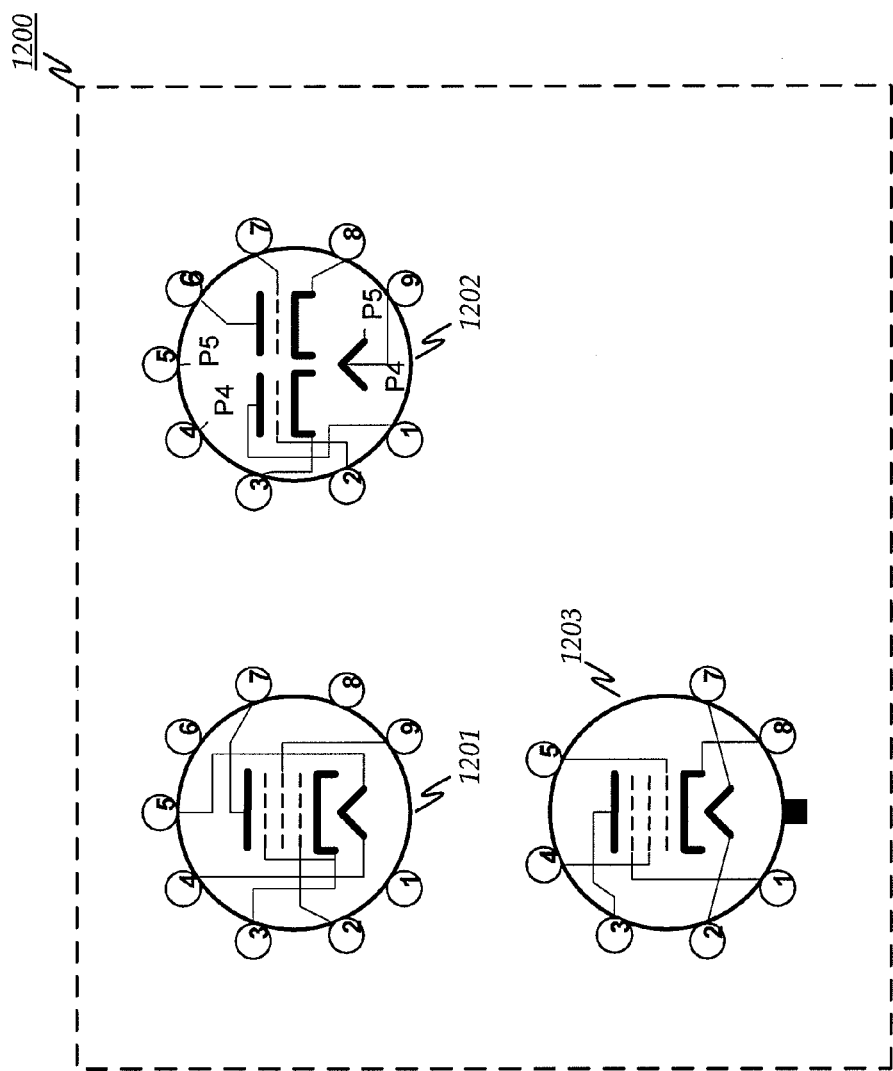
FIG. 12 illustrates example socket pin-configurations for example traditional glass-envelope vacuum tube devices that are contemplated for direct pin-replacement structures, all arranged in accordance with aspects of the present disclosure.

VTRDs can be configured as pin-for-pin compatible devices replace standard vacuum tube devices such as triodes and pentodes, with pin base arrangements such as octal 7-pin, octal 8-pin, Noval B9A, or other styles to name a few, thus allowing the user to retrofit VTRD's in place of existing glass vacuum tubes in a target amplifier. Each pin of an example VTRD may be arranged to function in a standard vacuum tube pin configuration such as, for example, one or more: plate, grid, cathode, and filament connections. The vacuum tube pin configurations may be for preamplifier vacuum tubes, power amplifier vacuum tubes, as well as combined preamplifier/power amplifier vacuum tubes. Example preamplifier vacuum tubes include styles such as: 12AX7, 12AT7, 12AU7, 6922, 7025, 6CG7, etc. Example power amplifier vacuum tubes include styles such as: EL34, EL84, 6L6, 6V6, 6550, 5881, KT66, KT88, etc. FIG. 12 illustrates example socket pin-configurations for example traditional glass-envelope vacuum tube devices that are contemplated for direct pin-replacement structures. Although described with reference to vacuum tube replacement devices, the VTRD is also equally useful in non-vacuum tube replacement applications such as audio amplifier circuits.

Example System

FIG. 1 is a block diagram (100) illustrating an example arrangement between an analog audio input source (130) and a target amplifier (120), via an audio encode/decode system (110). The audio encode/decode system (110) includes a code modulator/demodulator (111), encode/decode signal mixer (112), external controller interface (113), analog audio processing system (114), and a user interface (115). The audio encode/decode system (110) includes an amplifier terminal (116), an external control terminal (117), and an analog audio terminal (118). The code modulator/demodulator (111) is coupled to the encode/decode signal mixer (112). The analog audio processing system (114) is coupled to the encode/decode signal mixer (112). The encode/decode signal mixer (112) is coupled to the amplifier terminal (116).

The target amplifier (120) is an example of a traditional vacuum tube amplifier circuit that is retrofitted with VTRDs. The example target amplifier 120 includes an example cascade arrangement of signal amplifier stages including the VTRD preamp stage 1 (referred to hereafter as the VTRD first input stage) (121) coupled through to VTRD preamp stage N (122), further coupled to the power amp (123) in signal amplifying manner (i.e., input-to-output). The power amp output is coupled to the speaker (125). The target amplifier filament power supply (124) supplies AC or DC filament (or heater) power to the VTRD stages in the target amp via filament supply wires (126) and (127). The target amplifier (120) includes an amplifier input terminal (128).

An analog audio input source (130), such as from a musical instrument (e.g., guitar, piano, voice, etc.), includes an output terminal (131), which would otherwise be directly coupled to the target amplifier input (128). The output terminal (131) of the analog audio input source (130) is coupled to an analog audio terminal (118) of the audio encode/decode system (110). An external controller (140), such as a musical instrument digital interface (MIDI) control or a computer system via an interface (e.g., USB interface, Firewire (IEEE 1394) interface, Serial interface, parallel interface, etc.) includes an interface terminal (141) that is coupled to the audio encode/decode system (110) via an external control terminal (117).

The audio encode/decode system (110) can be configured to generate VTRD communication signals that contain spectral energy that is ideally outside of the audio spectrum (i.e., inaudible signals as will be described later), and mixes the VTRD communication signals with an analog audio signal from the audio input source (130). The mixed signal is then coupled to the target amplifier (120) audio input terminal (128) via the amplifier terminal (116). The mixed signal can then be decoded by the VTRDs (e.g., 121-123) inside the target amplifier (120) so that various functions and configurations of the VTRDs (121-123) can be achieved without modifying the target amplifier (120). The use of an inaudible communication signal mixed with the analog audio signal demonstrates a novel approach that facilitates the configuration and control of VTRDs using the existing target amplifiers (120) audio input (128) as the target amplifiers communication port.

The audio encode/decode system (110) employs a code modulator/demodulator (111) that generates the communication signals for receipt by one or more VTRDs in the target amplifier (120). The audio encode/decode system (110) can also be configured to use the code modulator/demodulator (111) to demodulate communication signals received from the target amplifier (120) via amplifier terminal (116). Example modulation and demodulation techniques will be discussed in further detail throughout the present disclosure.

Analog audio input signals from the analog audio input source (130) may optionally be processed by the analog audio processing system (114), which may include any desired signal processing function such as input signal buffering, gain modification, frequency response modification, or any other desired analog transfer function modification. The analog audio processing system (114) can be implemented using analog signal processing functions, or digital signal processing functions as may be desired. The output of the analog audio processing system is another analog signal that is referred to as a processed analog audio signal. In a simplest implementation, the audio processing system (114) may simply be a buffer circuit.

The processed analog audio signal is mixed with the encoded communication signal from the code modulator/demodulator (111) via the encode/decode signal mixer (112). The mixed signal is coupled through the amplifier terminal (116) to the analog audio input terminal (128) of the target amplifier (120). In one example, the amplifier terminal (116) can be coupled to the analog audio input terminal (128) using a standard audio cable such as commonly used to couple musical instruments to amplifiers (i.e., ¼' jack audio cable).

A user interface (115) is optionally employed to allow the user to make adjustments or store settings for operating parameters associated with individual VTRDs employed in the target amplifier (120). The user interface (115) may include buttons, knobs, a display such as an LCD display, touch-screen, etc., as may be desired. The external controller interface (113) may optionally be used to extend and/or replace the user interface capability by allowing the operator to access controls via a MIDI foot pedal, for example. Various control signals for the code modulator/demodulator (111) are adjusted in response to the user interface (115) and/or the external controller interface (113) so that encoding/decoding of address and command/data information can be facilitated.

The various functional and/or physical partitions illustrated by FIG. 1 are merely intended to serve as example functional and/or physical partitions, and the various partitions may be separated or integrated into one or more different physical and/or functional partitions. Not every subsystem and circuit may be required in all applications, and thus the elimination of various functional partitions is considered within the scope of the present disclosure.

Example Coder/Decoder

Figure 2:
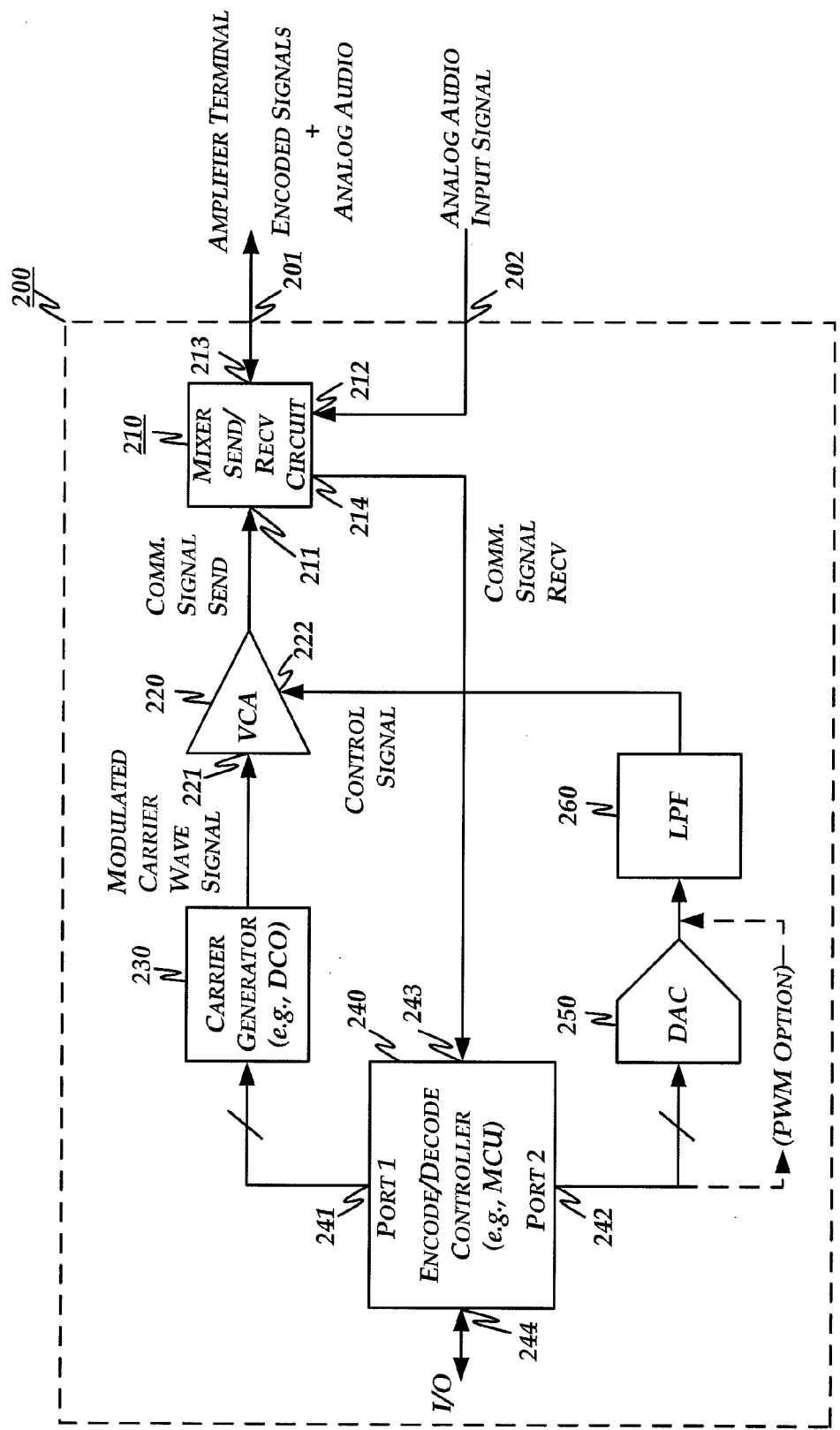
FIG. 2 illustrates the functional and/or physical partitions of an example code modulator/demodulator and encode/decode signal mixer used in an audio encode/decode system.

FIG. 2 illustrates an example code modulator/demodulator and encode/decode signal mixer circuit (200) for use in an audio encode/decode system (See 110 of FIG. 1). Circuit 200 includes a mixer send/receive circuit (210), a voltage controlled amplifier circuit (VCA, 220), a carrier generator circuit (230), an encode/decode controller circuit (240), a digital-to-analog converter (DAC) circuit (250), and a low pass filter (LPF) circuit (260).

Circuit (200) includes an amplifier terminal (201) and an analog audio terminal (202). The encode/decode controller circuit (240) is coupled to the carrier generator circuit (230) via port1 (241), which may be an analog or digital interface port. Example digital interface ports may include serial ports such as I2C or SPI, or parallel ports. The carrier generator circuit (230) is arranged to generate a modulated carrier wave signal and is coupled to the input terminal (221) of the VCA circuit (220). Port2 (242) of the encode/decode controller circuit (240) is coupled to the DAC circuit (250), which may be a serial or parallel digital port as previously described with regards to port1 (241). Port2 (242) may optionally be a pulse-width-modulation (PWM) output, in which case the DAC circuit (250) may be eliminated. The analog output of the DAC circuit (250) (or PWM for cases where the DAC circuit is eliminated) is coupled to a control input terminal (222) of the VCA circuit (220) through the LPF circuit (260), which can be used as an integrator/smoothing filter. The output of the VCA circuit (comm. signal send) is a modulated communication signal (e.g., see discussion of FIGS. 4 and 5) that is coupled to the input terminal (211) of the mixer send receive circuit (210). The analog audio input signal received from the analog audio terminal (202) is coupled to another input terminal (212) of the mixer send receive circuit (210). The final composite analog mix of the comm. signal from the VCA circuit (220) and the analog audio input signal is provided through an input/output terminal (213) of the mixer send receive circuit (210) to the amplifier terminal (201).

Communication query/response signals may also be received from the target amplifier via the amplifier terminal (201). The communication query/response signals can be separated from audio spectra and converted to digital signals by the mixer send/receive circuit (210) as will be described in further detail in FIG. 3. The resulting digital signals (i.e., comm. signal receive) can then be conveyed (via output terminal 214) to an input terminal (243) of the encode/decode controller circuit (240) for further processing.

The encode/decode controller circuit (240) may be a micro controller unit (MCU) or other processing device. The encode/decode controller circuit (240) is configured to provide appropriate control signals to encode and/or decode communication signals for/from the target amplifier. An I/O terminal (244) can be used by the encode/decode controller circuit (240) to facilitate receipt of command/data input signals or coupling decoded output signals to subsystems of the audio encode/decode system (110). Example subsystems for the audio encode/decode system (110) include the user interface (115) and/or an external controller interface (113) described earlier. Example command input signals, which may be input from the user interface (115), include target amplifier VTRD selection (e.g., select VTRD 123 from FIG. 1), VTRD transfer function adjustments (gain, frequency response, etc.), or storing the current user/VTRD settings, data etc. Example decoded output signals may include the retrieval of VTRD transfer function settings from the target amplifier, a "state-of-health" of specific VTRDs in the target amplifier, or a status condition of the target amplifiers various power supplies, etc., to name a few. For example, the audio encode/decode system (110) may query the target amplifier (120, retrofitted with communication compatible VTRDs) for the target amplifiers B+ (high voltage) supply value or condition. As another example, the audio encode/decode system (110) may specifically query individual VTRDs in the target amplifier for the quiescent current or bias value or condition, to name a few.

The carrier generator (230) is configured to generate a modulated carrier wave signal such as an analog amplitude modulated (AM) or frequency modulated (FM) oscillation signal, or a digitally controlled oscillator (DCO) signal, etc. The fundamental frequency generated for the modulated carrier wave signal will ideally be above the audio spectrum (described later), such as a 200 KHz sine wave for example. The modulated carrier wave signal can further be envelope modulated by the VCA circuit (220) via a control signal applied to the control terminal (222) from the output of the LPF circuit (260). In one example, the control signal is arranged to envelope modulate the carrier wave signal with a Hanning time-domain window function (described later) with a fundamental frequency below the audio spectrum. In some examples, VCA circuit (220) may be implemented as a voltage multiplier circuit.

The example embodiment of FIG. 2 demonstrates a system for generating inaudible communication signals mixed with analog audio signals. The mixed signals can then be used to interface with VTRDs that are present in the target amplifier. The example embodiment illustrated in FIG. 2 also demonstrates a method for receiving communication signals from VTRDs that are present in the target amplifier. The various functional and/or physical partitions illustrated by FIG. 2 are merely intended to serve as example functional and/or physical partitions, and the various partitions may be separated or integrated into one or more different physical and or functional partitions as may be desired.

Example Mixer

Figure 3:
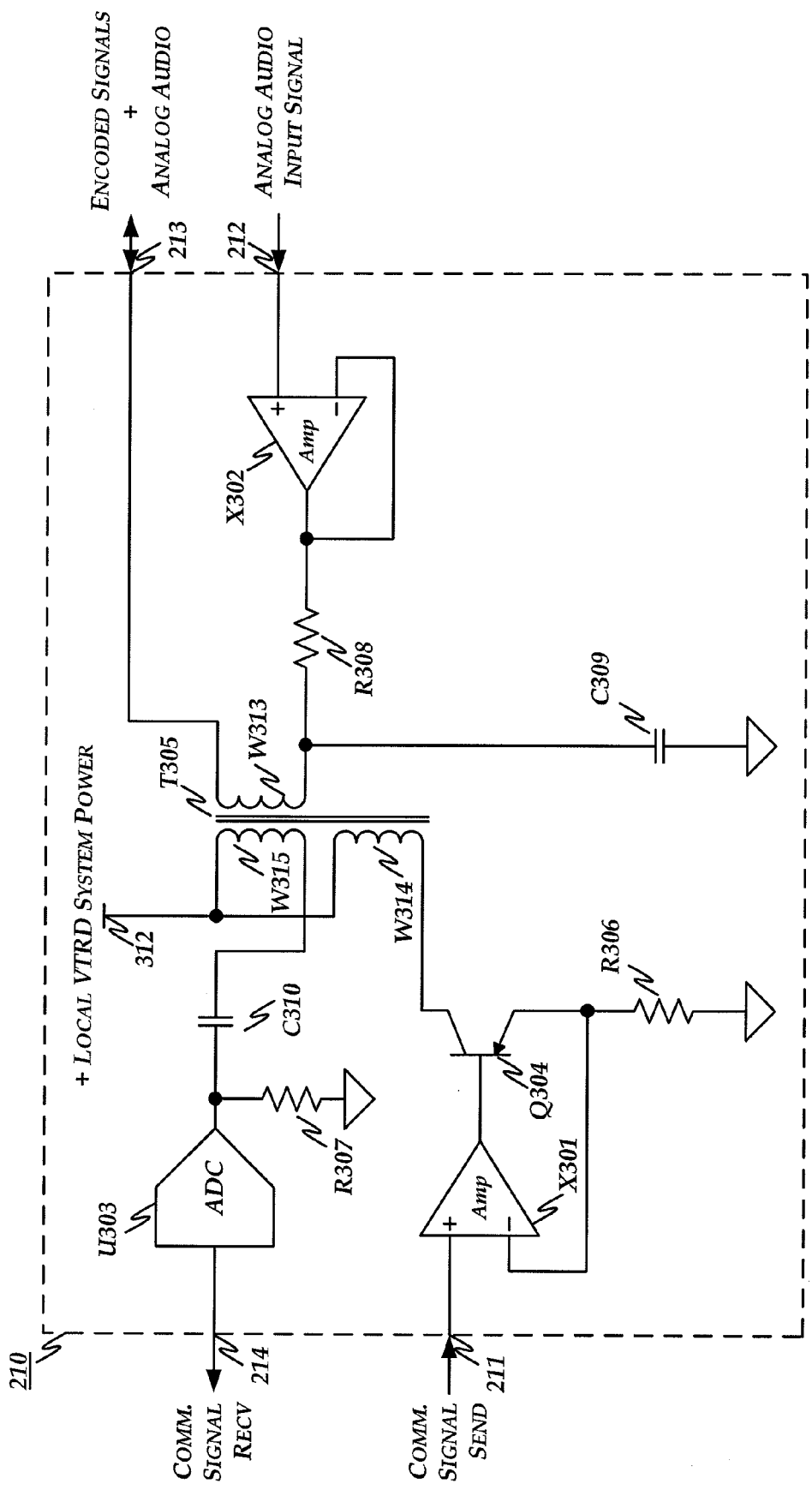
FIG. 3 illustrates an example circuit arrangement for a mixer send receive circuit.

FIG. 3 illustrates an example mixer send/receive circuit (210). The circuit (210) includes op-amps circuits (X301 and X302), a ADC circuit (U303), a transistor circuit (Q304), a transformer circuit representing a 3-port network (T305) consisting of windings W313-W315, three resistors circuits (R306-R308), two capacitors circuits (C309 and C310), and system power (312). The circuit (210) includes a comm. signal send terminal (211), an analog audio input terminal (212), an amplifier terminal (213), and a comm. signal receive terminal (214).

The comm. signal send terminal (211) is coupled to the non-inverting input terminal (+) of op-amp circuit X301. The output of op-amp circuit X301 is coupled to the base of transistor circuit Q304. The emitter of transistor circuit Q304 is coupled to the inverting input terminal (−) of op-amp circuit X301 and one terminal of resistor circuit R306. The other terminal of resistor circuit R306 returns to ground forming a voltage-controlled current source circuit between X301, Q304, and R306. The collector of transistor circuit Q304 is coupled to the transformer circuit (T305) winding W314, the remaining side of winding W314 of which is coupled to the local VTRD system power (312). The analog audio input terminal (212) is coupled to the non-inverting input terminal (+) of op-amp circuit X302. The inverting terminal (−) of op-amp circuit X302 is coupled to the output terminal of op-amp circuit X302 forming a voltage buffer circuit. The output of op-amp circuit X302 is coupled to one terminal of resistor circuit R308. The other terminal of resistor circuit R308 is coupled to the transformer circuit (T305) winding W313 and to one terminal of capacitor circuit C309. The other terminal of capacitor circuit C309 returns to ground. The remaining side of winding W313 is coupled to the amplifier terminal (213). The comm. signal receive terminal (214) is coupled to the output of ADC circuit U303. One side of transformer circuit T305 winding W315 is coupled to one terminal of capacitor circuit C310. The remaining side of winding W315 is coupled to the local VTRD system power (312). The other terminal of capacitor circuit C310 is coupled to the input of the ADC circuit U303 and one terminal of resistor circuit R307. The other terminal of resistor circuit R307 returns to ground. Capacitor circuit C310, resistor circuit R307, and ADC circuit U303 form an analog-to-digital converter with low-frequency rejection. The ADC circuit (U303) may be a successive approximation type converter, sigma-delta type converter, comparator, etc.

A high-pass filter arrangement is represented by capacitor circuit C310 and resistor circuit R307. The intent of the low frequency rejection provided by the high-pass filter is to remove any audio band spectra from the received communication signals from the amplifier terminal (213). It should be noted that there are two high-pass filter poles represented between the amplifier terminal (213) and the input of the ADC (U303) when the transformer circuit T305 is included in the transfer function. Adjustments to the low frequency rejection filter coefficients can be modified as required based on the expected frequency range of carrier wave signals.

Capacitor circuit C309 is arranged to couple the signal at the junction of R308/C309/W313 to ground at high frequencies, such as expected for the communication signal (e.g., 200 KHz carrier wave), and decouples the signal at the junction of R308/C309/W313 from ground at audio frequencies. Resistor circuit R308 provides current limiting and isolation to minimize the demand on the output of op-amp circuit X302 to drive capacitance and/or return high frequency communication signal energy. A low-pass pole is established by the combination of resistor circuit R308 and capacitor circuit C309, which is ideally expected to be above the audible audio band (e.g., around 50 KHz) so as to minimize distortion to the original analog audio signal and maintain high audio signal quality.

The communication signal present at terminal 211 (comm. signal send) is arranged to modulate current flowing through winding W314 of transformer circuit T305 via the voltage-controlled current sink functional arrangement established by X301, Q304, and R306. The communication signal energy is coupled from winding W314 to winding W313 of the transformer circuit T305 and mixed with the analog audio input signal from analog audio input terminal 212 via the buffering op-amp circuit X302. The resulting composite encoded signal plus audio is coupled to the amplifier terminal (213).

Encoded communication signal energy is coupled to the amplifier terminal (213) by the target amplifier, such as is expected during a query/response operation, which is coupled to winding W313 of transformer circuit T305. As stated previously, the comm. signal energy received is processed with the audio band rejection filter established by C310 and R307. The signal is then converted to a digital form by the ADC circuit U303 and coupled to the comm. signal receive terminal (214).

The various functional and/or physical partitions illustrated by FIG. 3 are merely intended to serve as example functional and/or physical partitions, and the various partitions may be separated or integrated into one or more different physical and or functional partitions as may be desired.

Example Envelope Modulated Signals

Figure 4A:
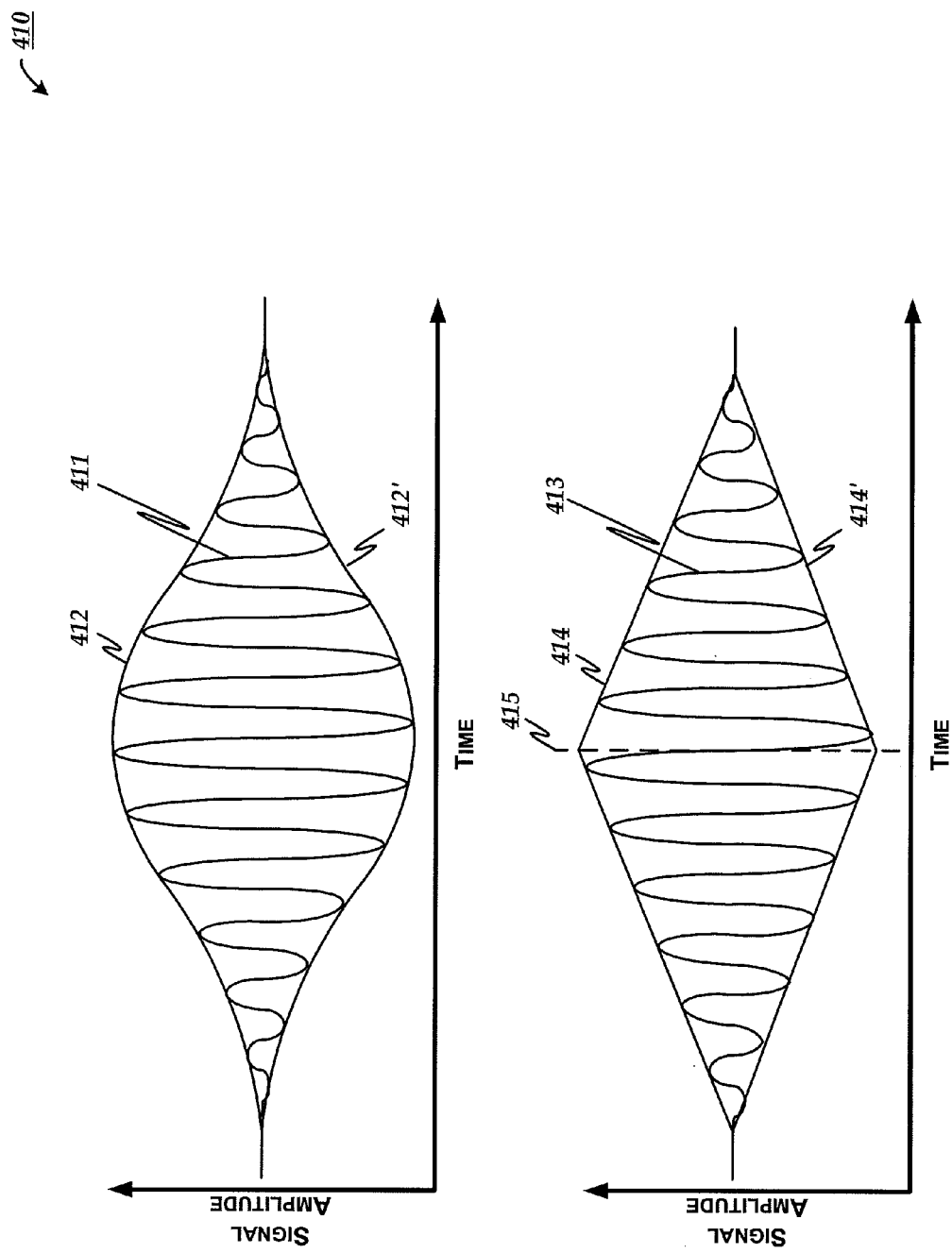
FIG. 4A illustrates example burst communication signal energy with inaudible envelope and carrier components.

FIG. 4A illustrates example communication signals including a modulated carrier wave signal that is envelope modulated. The envelope is preferably arranged to modulate the amplitude of the signal so that signal energy does not generate any audible signal components.

The example signals are composed of sine-wave carrier signals (411 and 413) and two example amplitude modulated envelopes (412, 412' and 414, 414'). As mentioned previously, the sine-wave carrier has a fundamental frequency that is ideally well above the audio band, such as 200 KHz for example (e.g., spectral region 423 in FIG. 4B). The example envelope 412/412' has a fundamental frequency below the audio band, such as 5 Hz-15 Hz for example (e.g., spectral region 421 in FIG. 4B). The example envelope 412/412' may be a Hanning, Hamming or other time domain window function that is arranged to minimize harmonic artifacts generated from the envelope, thus reducing possible imaging or harmonic spurs that may otherwise be reflected in the audible audio band. The Hanning window function is defined in EQ1.

$$f(t) = \alpha - (1-\alpha)\cos\left(\frac{2\pi t}{N}\right), \qquad \text{EQ 1}$$

t=0, 1, . . . , N−1. Alpha (α) may be adjusted for various amplitudes (e.g., 0.5=Hanning, 0.54=Hamming). The composite communication signal energy is inaudible because the spectral composition of the signal energy is "outside" of the audio range (above and below).

An alternate envelope modulation scheme is contemplated using a linear technique as shown with the envelope 414/414'. In this example, the envelope derivative transition is ideally aligned at the zero-crossing (415) of the carrier signal (413), such that the net signal energy is also zero during the transition. As such, as long as the harmonic energy of the envelope and carrier are maintained below and above (respectively) the audible audio band, a "noiseless" communication signal is provided.

It is contemplated that such communication signals can occur as burst energy on demand when mixed with the analog audio input signal. The communication signals presented in FIG. 4A are merely a few example methods for establishing "noiseless" communication signal energy of which other methods are also contemplated.

Figure 4B:
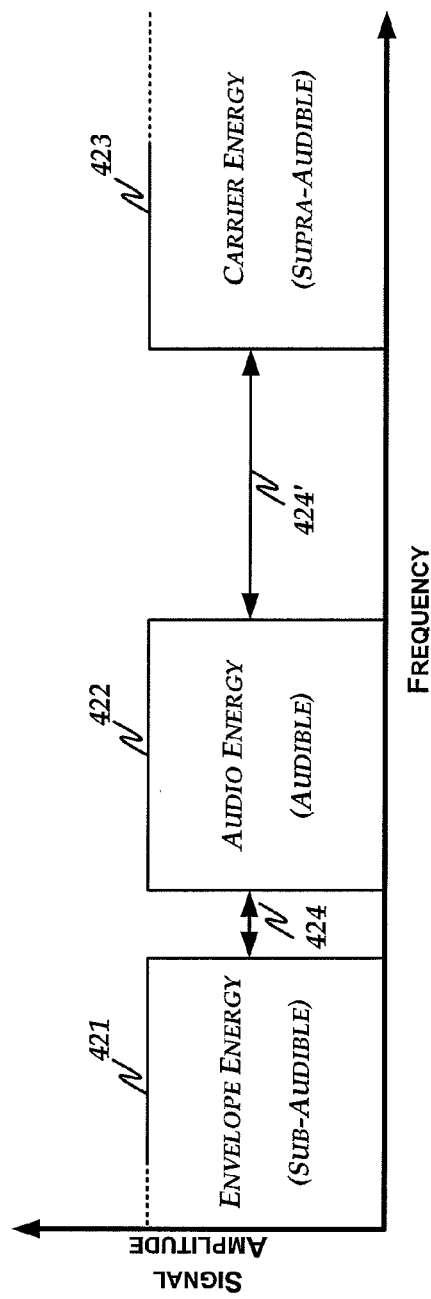
FIG. 4B illustrates example spectral regions used to facilitate noiseless (inaudible) communication signal energy in VTRD audio application.

FIG. 4B illustrates isolated spectral partitions associated with a VTRD communication signal demonstrating ideal regions of operation for the communication signal components (as described for FIG. 4A). The spectral partitions are separated into three regions including the below or sub-audible region (421), an audible region (422) and an above or supra-audible region (423). The carrier envelope (e.g., 412, 412' and 414, 414') described for FIG. 4A will ideally contain energy in spectral region 421 (e.g., below 15 Hz, such as in a range from about 5 Hz to about 15 Hz). An example energy spectrum for audio signals is typically defined in the range from 20 Hz to 20 KHz, which is illustrated by region 422. The carrier signals (e.g., 411 and 413) described for FIG. 4A will ideally contain energy in spectral region 423 (e.g., above 100 KHz). Ideally, the regions (421-423) are separated by some spectral margin (424, 424') so as to minimize critical filtering requirements otherwise necessary to isolate the communication signal components from the audio signal components and to allow some margin for harmonic spread of the envelope and carrier energy without crossing into an audible region of the audio band (422).

Figure 5:
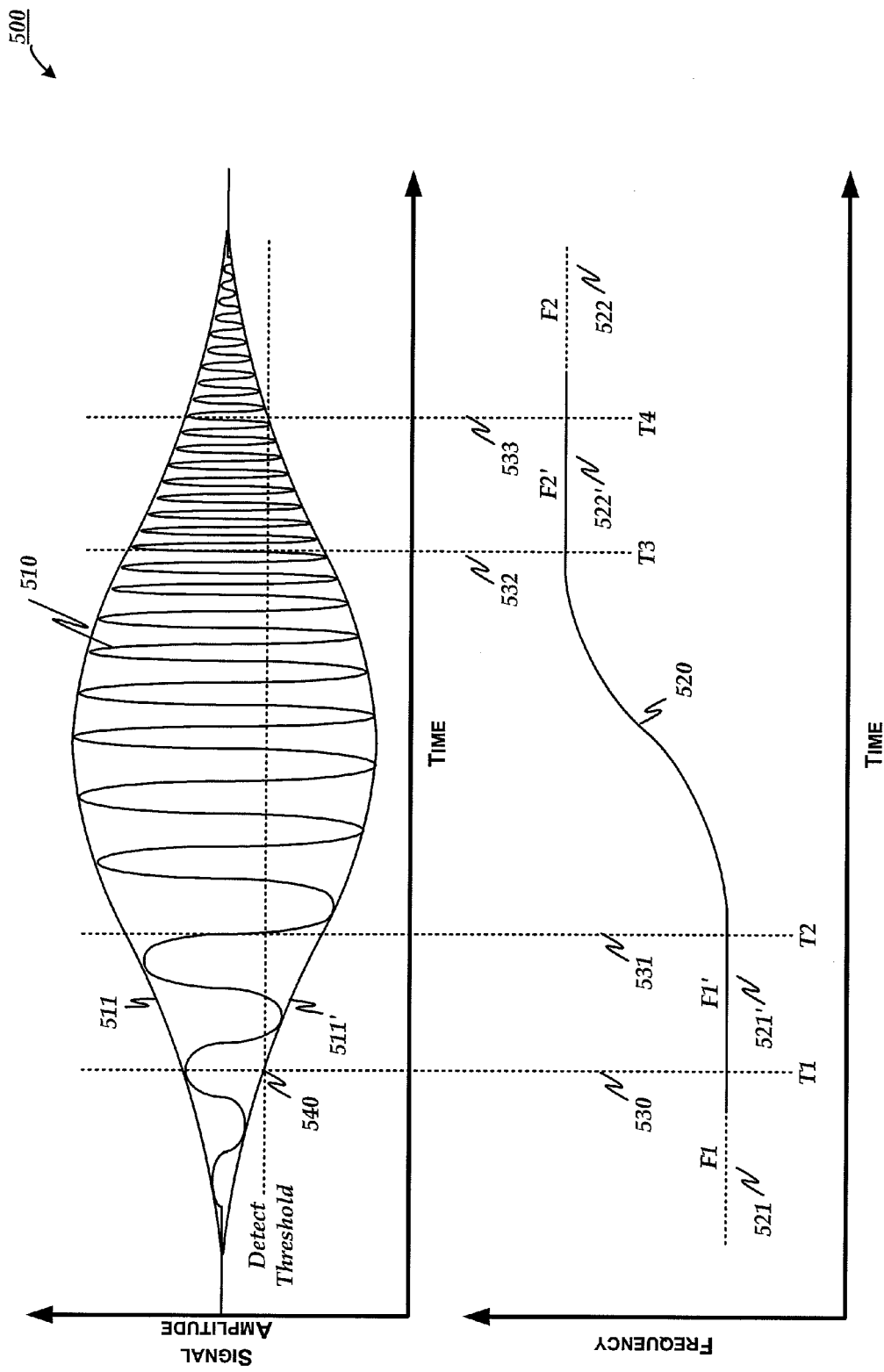
FIG. 5 illustrates an example VTRD communication signal which includes a frequency modulation encoding scheme that minimizes the production of in-band audio harmonic energy.

FIG. 5 illustrates an example communication signal that includes a frequency modulation encoding scheme. The communication signal is composed of a frequency modulated sine-wave carrier (510) and an amplitude modulated Harming envelope (511/511'), as described previously, and a sweep function (520). The start frequency is F1 (521) and the end frequency is F2 (522). The sweep function starts at time T1 (530), dwells at frequency F1' (521') until time T2 (531), then sweeps to frequency F2' (522') at time T3 (532), dwells at frequency F2' (522') until time T4 (533), for the final end frequency F2 (522). F1' (521') is the dwell time for F1 (521), i.e., F1' ideally equals F1. F2' (522') is the dwell time for F2 (522), i.e., F2' ideally equals F2. T2 (531) minus T1 (530) is the dwell time for F1' (521'). T4 (533) minus T3 (532) is the dwell time for F2' (522'). The frequency change from F1' (521') and F2' (522') is defined by the frequency sweep function (520). The example sweep function (520) attributes can be arranged similar to the previously described Hanning function in that the sweep function (520) is derived from portions of the sine/cosine series, wherein a fundamental and harmonic energy associated with the sweep of the carrier signal is outside of the audible frequency band. Composing the encoded communication signal using sine-wave-like components (e.g., carrier, envelope, and modulation) minimizes the contribution of in-band-audio harmonic artifact which would otherwise be present with other functions containing discontinuous derivative properties.

Any variety of encoding schemes can be employed in the modulated waveform. In one example, discrete carrier frequencies are assigned to different discrete values for interpretation by a VTRD. For example, the frequency associated with the modulated carrier wave may be indicative of a four bit data word, where one of sixteen discrete carrier frequencies is selected to encode each four bit data word (e.g., f1=0000, f2=0001... f16=1111). In another example, four frequencies are selectively combined into one of fifteen combinations within an envelope so that each envelope indicates one of fifteen different values (e.g., f1 alone=0001, while f1, f2, f3 and f4 together=1111). In still another example, a start and stop frequency in a sweep may be encoded to indicate a desired values. Many other data encoding schemes are also contemplated and considered within the scope of the present disclosure.

FIG. 5 also illustrates an example detection threshold (540) (i.e., energy detected=true... see FIGS. 6B and 6D), which may be an arbitrary fixed or adjustable comm. signal amplitude at which point the comm. signal is detected by the VTRD or external user interface (e.g., T1). The detection threshold (540) may also indicate a comm. signal burst complete (e.g., T4, energy detected=false).

Example State Diagram/Process Flow

FIGS. 6A-6E illustrate example processing blocks diagrams and example process flow charts for evaluating decoded address and command or data signals from transmitted communication signal energy associated with a VTRD.

Figure 6A:
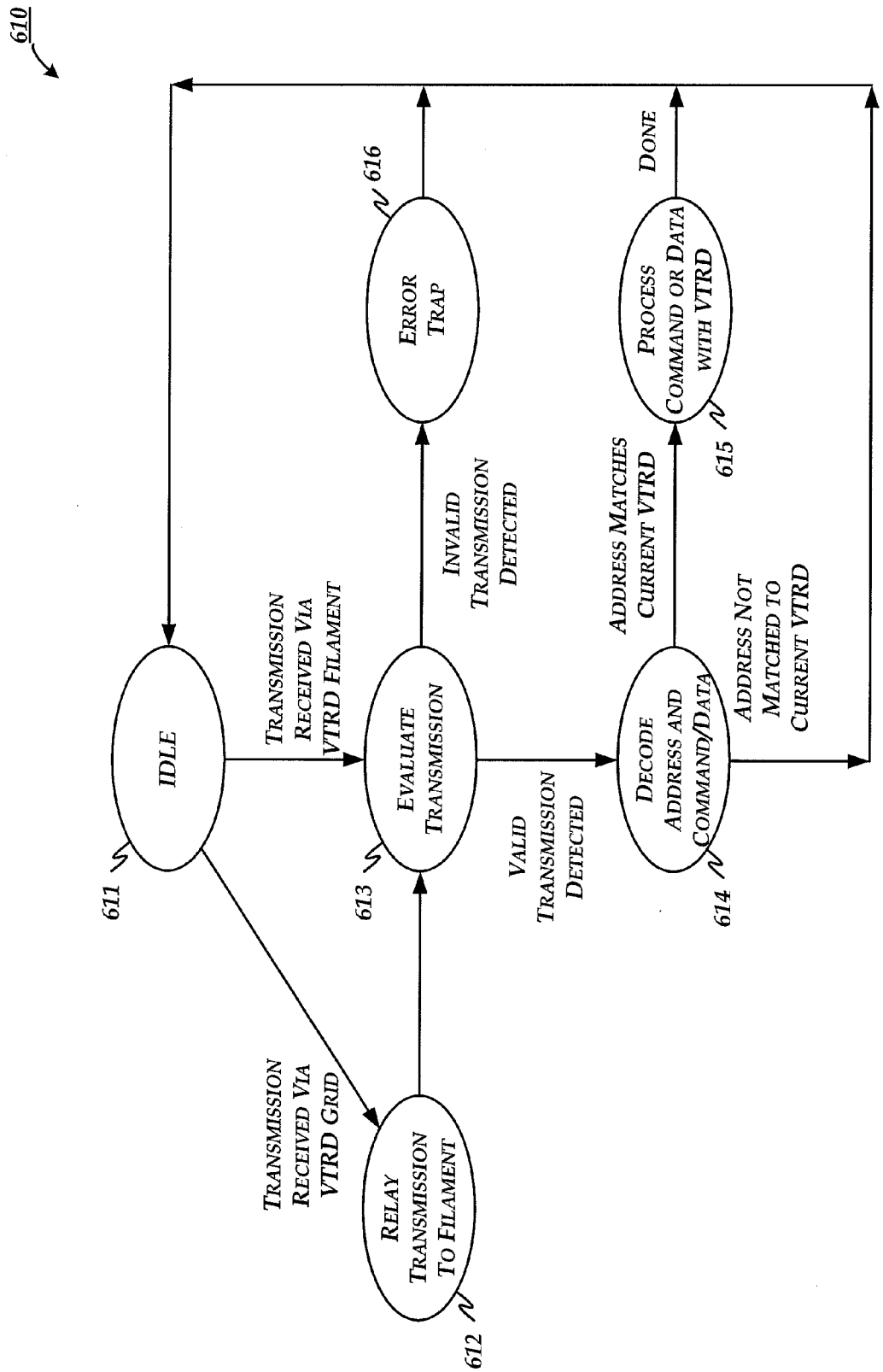
FIG. 6A illustrates an example state diagram for evaluating decoded address and command or data signals from transmitted communication signal energy associated with a VTRD.

FIG. 6A is a processing block diagram (610) associated with decoding address and command/data processing functions in an example VTRD, including an idle block (611), a relay transmission to filament block (612), an evaluate transmission block (613), a decode address and command/data block (614), a process command or data block (615), and an error trap block (616). The processing illustrated in FIG. 6A demonstrates one example system for a VTRD to receive transmissions that are encoded with address and command/data information in a single burst.

Processing flows from the idle block (651) to the relay transmission to filament block (612) when a transmission is received from the grid terminal of the VTRD. The received signals from the grid terminal are transmitted to other VTRDs in a broadcast fashion as will be described in further detail in FIGS. 7 and 8. The relay transmission to filament block (612) transitions to the evaluate transmission block (613). Alternatively, if the transmission is detected as received from the filament supply, then processing flows from the idle block (611) to the evaluate transmission block (613).

At the evaluate transmission block (613), the signal transmission is evaluated using any of the prior described techniques such as single frequency tone analysis, swept frequency analysis, histogram analysis, etc. Processing flows from block 613 to the error trap block (616) when an invalid transmission is detected. Otherwise, processing flows to block 613 to the decode address and command/data block (614) when a valid transmission is detected.

The decode address and command/data block (614) is arranged to decode symbols from the received transmission and buffer the symbols so that they can be evaluated to determine address and command or data information. Each symbol may be encoded as one or more frequencies from the transmission as further described throughout the present disclosure. Processing flows from block 614 to block 615 when the address of the current VTRD matches the decoded address. Otherwise processing returns to the idle block (611) when the decoded address does not match the current VTRD.

At block 615, commands or data associated with the currently addressed VTRD are evaluated. In one example, a command is identified and the VTRD is arranged to execute the command. In some other examples, data is identified such as from a previously issued command, and the VTRD is arranged to process the data accordingly. The interpretation of either commands or data can be handled by a higher level software application such as might be processed by an MCU in the VTRD (e.g., see FIG. 7). After the commands and/or data are handled by the VTRD, processing returns to the idle state (611) where the VTRD waits for additional communication bursts.

Figure 6B:
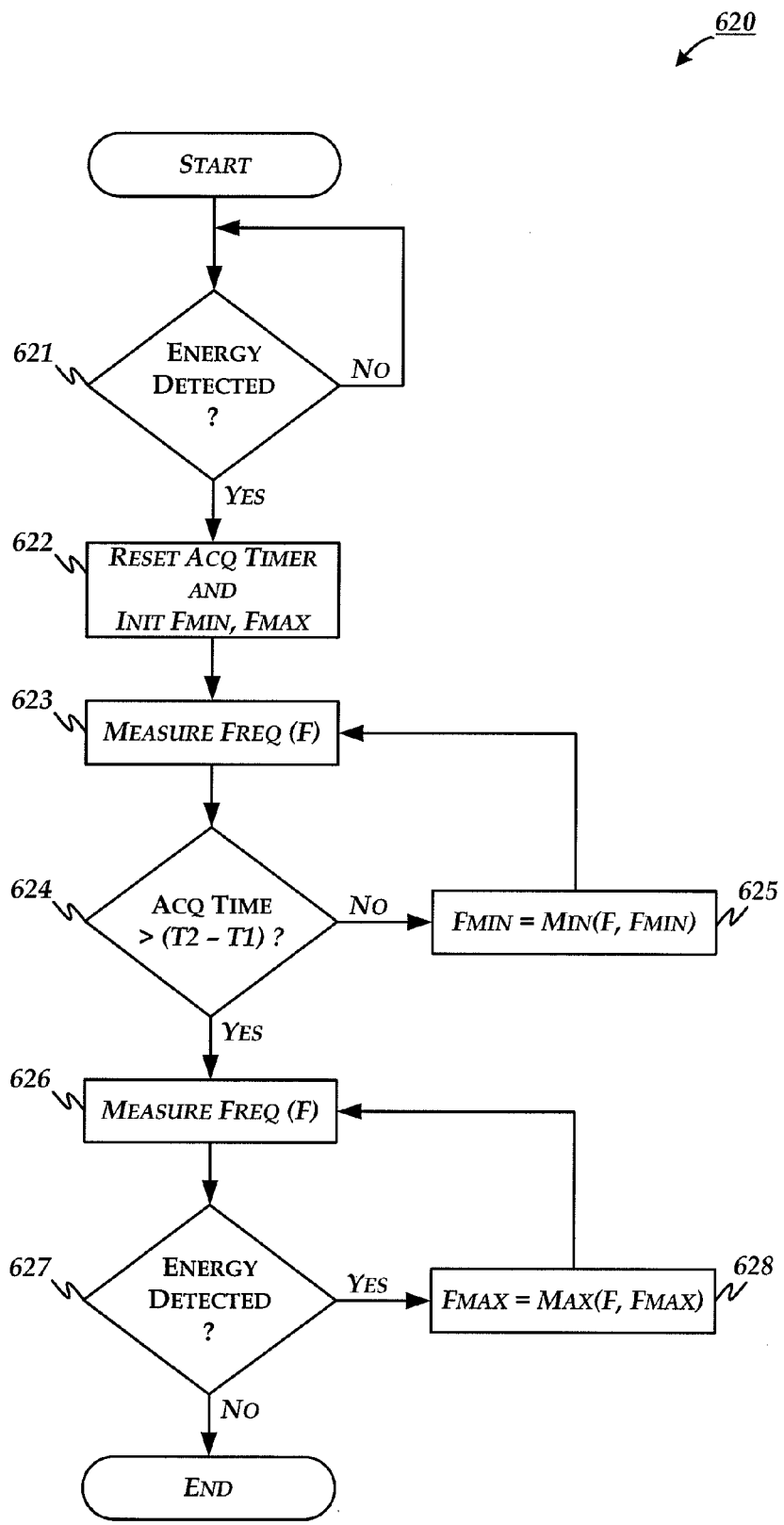
FIGS. 6B-6D illustrate example process flow diagrams for evaluating decoded address and command or data signals from transmitted communication signal energy associated with a VTRD.

FIG. 6B is an example flow chart (620) for a process of decoding address and command information from a burst communication signal associated with a VTRD using captured frequency measurements to identify address and command information. FIG. 6B includes processing blocks 621-628.

The captured frequency measurements for this example are similar to that described previously for FIG. 5, where a swept frequency is utilized inside of the modulated envelope to encode information in the transmission. A first frequency is utilized at the beginning of the modulated envelope (e.g., a start frequency) to indicate one portion of encoded information (e.g., address), while a second frequency is utilized at the end portion of the modulated envelope (e.g., an end frequency) to indicate another portion of the encoded information (e.g., command or data).

Processing begins at decision block 621 (ENERGY DETECTED) where the system continuously monitors received energy to determine if a transmission is detected. The system will proceed from decision block 621 to block 622 when received energy is detected (e.g., detecting a signal exceeding a threshold such as threshold 540 at time T1 from FIG. 5). At block 622 (RESET ACQ TIMER AND INIT FMIN, FMAX), the system is arranged to reset an acquisition timer and initialize various parameters such as a maximum frequency measurement (FMAX) and a minimum frequency measurement (FMIN). The acquisition timer is optionally employed to gate the capture interval for the first frequency measurement. In some examples, the maximum frequency measurement (FMAX) is initialized to a minimum value (e.g., 0 Hz), while the minimum frequency measurement (FMIN) is initialized to a maximum value that is normally considered far out of range (e.g., 1 MHz). Processing continues from block 622 to block 623.

At block 623 (MEASURE FREQ) the frequency of the received transmission is measured as F. Continuing to decision block 624 (ACQ TIME>(T2−T1)?), the acquisition timer is evaluated to determine if a time interval has expired for the initial acquisition interval (e.g., from time T1 to T2 in FIG. 5). When the acquisition interval has not expired, processing continues from decision block 624 to block 625. At block 625 (FMIN=MIN(F, FMIN)), the system is arranged to compare the current value of the frequency measurement (F) to the current minimum frequency measurement (FMIN). When the current frequency measurement is less than the prior value, FMIN=F. Otherwise FMIN remains unchanged. Processing continues from block 625 to block 623. After the acquisition interval has expired, processing continues from decision block 624 to block 626.

At block 626 (MEASURE FREQ), the frequency of a received transmission is again measured as F. Continuing to decision block 627 (ENERGY DETECTED?), the received energy is again monitored to determine if a transmission is present (e.g., detecting a signal is still above threshold 540 such as between time T1 and T4 in FIG. 5). When the received energy is still detected, processing continues from decision block 627 to block 628. At block 628 (FMAX=MAX(F, FMAX)), the system is arranged to compare the current value of the frequency measurement (F) to the current maximum frequency measurement (FMAX). When the current frequency measurement is greater than the prior value, FMAX=F. Otherwise FMAX remains unchanged. Processing continues from block 628 to block 626. After the received energy drops below the detection level (e.g., threshold 540 at time T4), processing from decision block 627 is terminated.

In some example implementations, no acquisition timer is used. In this instance, blocks 624 and 626 can be eliminated since only one frequency measurement block (e.g., 623) is necessary. Also in this example, block 625 and 628 can both be performed as long as energy is detected by decision block 627.

In some other example implementations, a histogram of frequency measurements (e.g., see FIG. 6D) can be used to determine the start and end frequencies and to reduce system noise. N separate histogram bins can be designated for each valid frequency range used in the system and the histogram bins can be evaluated once processing is complete to determine the start and end frequencies.

Figure 6C:
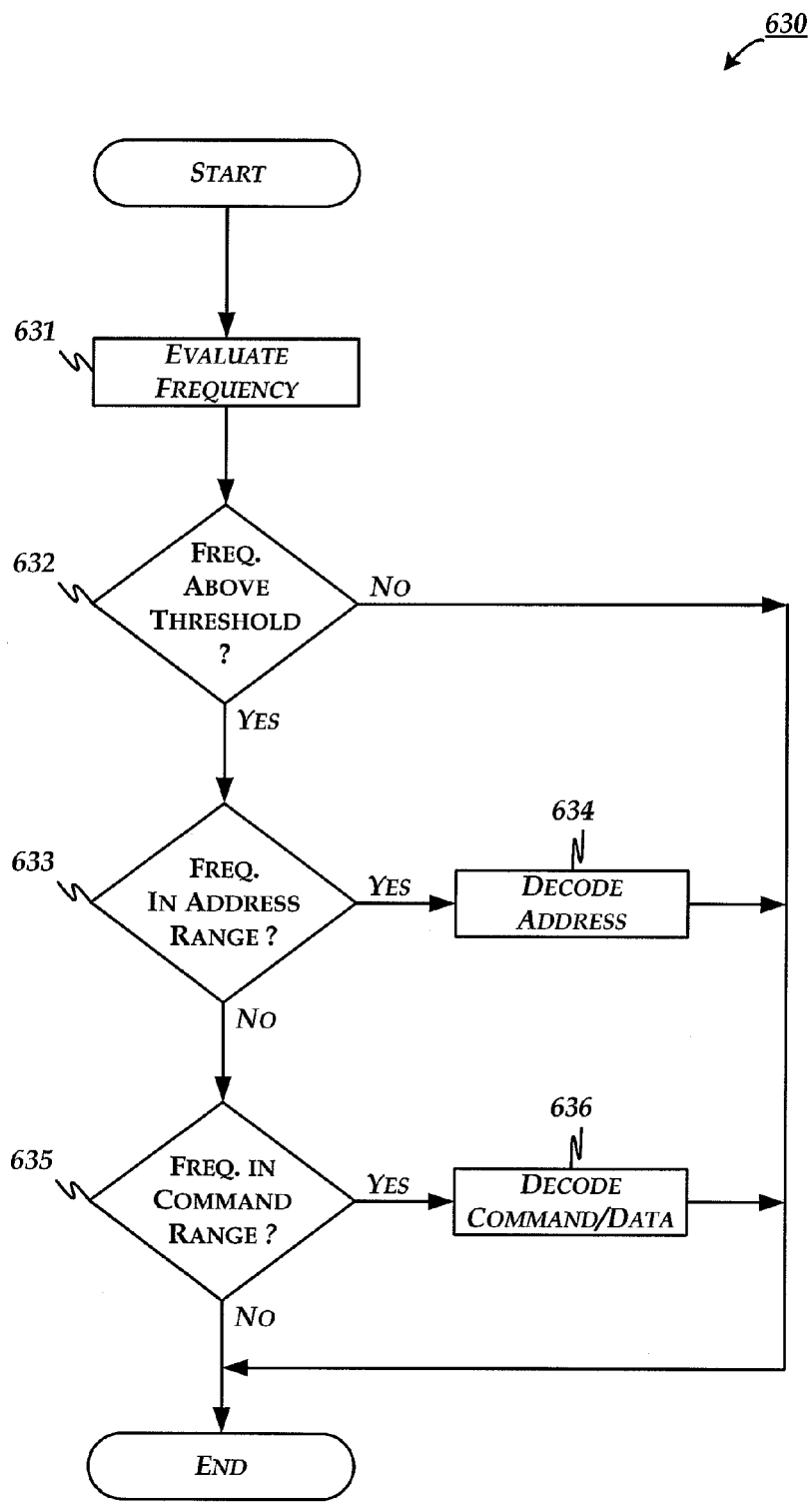

FIG. 6C is an example flow chart (630) for one example process of decoding address and command or data information from a burst communication signal associated with a VTRD. FIG. 6C includes processing blocks 631-636.

At block 631 (EVALUATE FREQUENCY), the system evaluates the frequency from the received transmission. Continuing to decision block 632 (FREQ. ABOVE THRESHOLD?), the system determines if the frequency of the received transmission is above a minimum frequencies associated with a valid transmission (e.g., above 100 kHz). Processing is terminated (or optionally error trapped) when the frequency of the received transmission falls below a valid frequency. Otherwise, processing flows from decision block 632 to decision block 633 when the frequency of the received transmission is above the minimum frequency for a valid transmission.

At decision block 633 (FREQ. IN ADDRESS RANGE?), the system evaluates the frequency of the received transmission to determine if the frequency falls within a range of frequencies that correspond to an address of a VTRD. When the frequency is within the address range for a VTRD, processing continues to block 634 (DECODE ADDRESS) where the address is decoded. An address may be decoded according to a one-to-one relationship between discrete frequencies and VTRD address assignments (i.e., f1=VTRD_address1, f2=VTRD_address2, f3=VTRD_address3, etc.). Although described as discrete frequencies, the individual frequencies may actually be designated as error tolerant frequency ranges (e.g., 200 kHz+/−5 kHz, 215 KHz +/−5 kHz, etc.). To facilitate evaluation of the frequencies, histogram bins can optionally be used so that noise tolerance is improved (e.g., See FIG. 6D).

Processing flows from decision block 633 to decision block 635 when the received frequency is determined as outside of the range for a VTRD address assignment. At decision block 635 (FREQ. IN COMMAND RANGE?), the system evaluates the frequency of the received transmission to determine if the frequency falls within a range of frequencies that correspond to a command or data for a VTRD. When the frequency is within the command range for a VTRD, processing continues to block 636 (DECODE COMMAND/DATA) where the command or data is decoded. Otherwise, when the frequency is outside of a range of frequencies associated with a command, processing flows from block 635 to a termination block or optionally to an error trap since the frequency is outside of a valid frequency range.

In some alternative examples, a multi-tone (or multiple-frequency) assignment of frequencies can be made for each address or command (e.g., f1=VTRD_address1, f2=VTRD_address2, f1+f2=VTRD_address3, f3=VTRD_address4 , f3+f1=VTRD_address5, etc.). For this example, histogram bins can again be used to identify each frequency tone as will be described with reference to FIG. 6D. The histogram bins are useful in that they have built in noise tolerance.

Figure 6D:
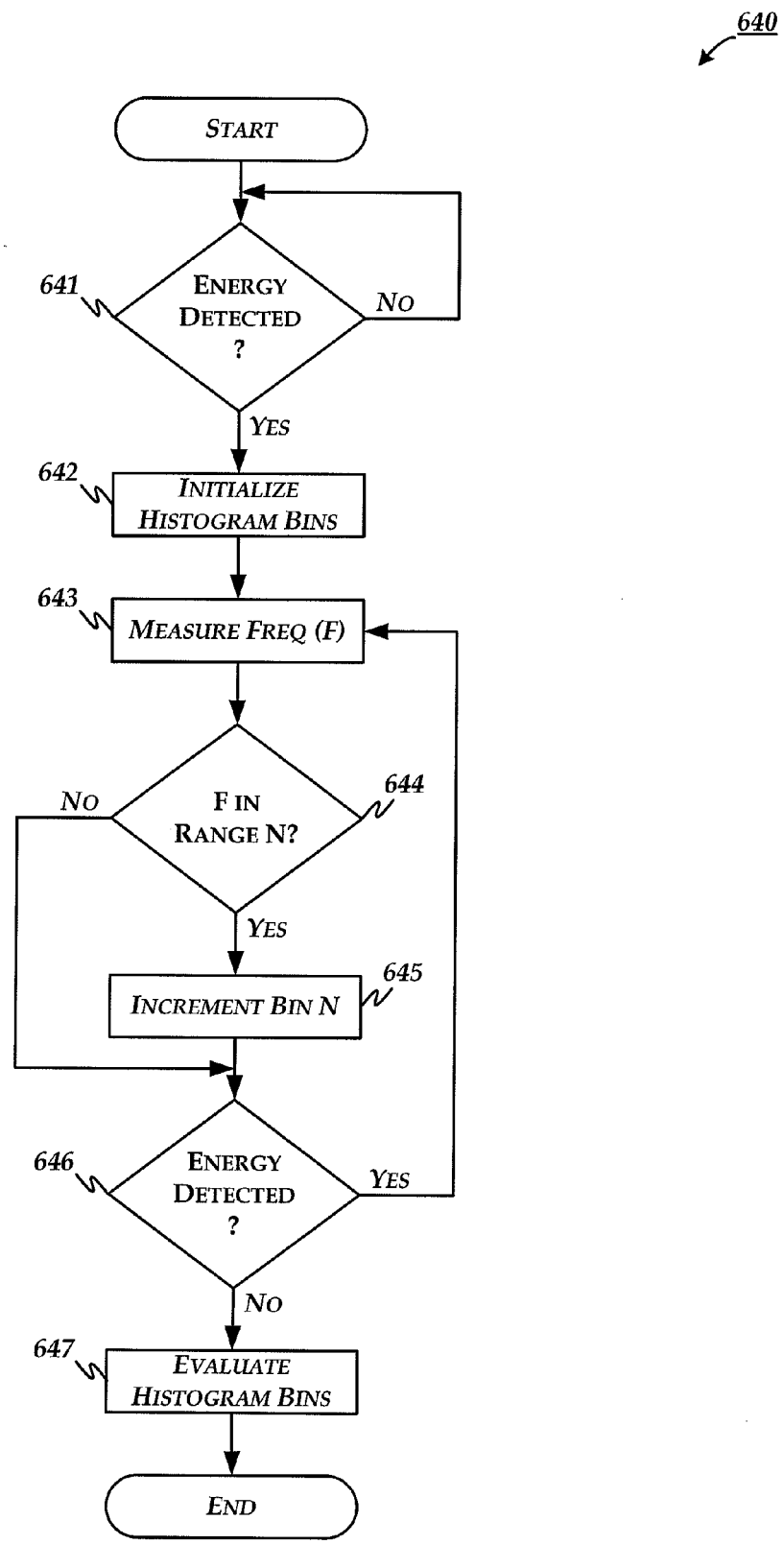

FIG. 6D is an example flow chart (640) for one example process of evaluating measured frequencies from a burst communication signal associated with a VTRD using a histogram based process. FIG. 6D includes processing blocks 641-647.

Processing begins at decision block 641 (ENERGY DETECTED) where the system continuously monitors received energy to determine if a transmission is detected. The system will proceed from decision block 641 to block 642 when received energy is detected (e.g., detecting a signal exceeding a threshold such as threshold 540 at time T1 from FIG. 5). At block 642 (INITIALIZE HISTOGRAM BINS), the system is arranged to initialize an array of histogram bins (1-N). Each histogram bin is assigned to an ideal valid frequency value that is associated with a valid modulated transmission to a VTRD. However, since exact frequencies may not be easily achieved, error tolerances are permitted within each bin as a range of frequencies centered about the ideal frequency. For example, an ideal frequency value of 200 KHz may vary by +/−5 KHz and still be considered "close enough". Each of the N histogram bins has its own respective range of valid frequencies (RANGE 1 . . . RANGE N) to account for errors in absolute values.

Processing flows from block 642 to block 643 (MEASURE FREQ), where the frequency of the received transmission is measured as F. Continuing to decision block 644 (F IN RANGE N?), the system compares the measured frequency (F) to each of the valid ranges for frequencies associated with the histogram bins. When a valid range of frequencies is detected for a particular histogram bin, processing flows from decision block 644 to block 645. Otherwise processing flows from decision block 644 to decision block 646 when the frequency (F) is outside of the range of all of the histogram bins.

At block 645 (INCREMENT BIN N), the histogram bin that has a frequency range corresponding to the measured frequency is incremented. The incrementing of the histogram bin can either be by a fixed amount (e.g., 1) or it can be scaled dynamically based on the measured signal amplitude or some other figure of merit. Stronger signal correlations can increment faster than weaker signal correlations so that noise immunity is further enhanced. Processing continues from block 645 to decision block 646.

At decision block 646 (ENERGY DETECTED?), the received energy is again monitored to determine if a transmission is present (e.g., detecting a signal is still above threshold 540 such as between time T1 and T4 in FIG. 5). When the received energy is still detected, processing continues from decision block 646 to block 643. Otherwise, when the received energy drops below the detection level (e.g., threshold 540 at time T4), processing flows from decision block 627 to block 647.

At block 647, the histogram bins are evaluated to identify the frequency tones that have the highest levels above the noise levels to indicate valid frequency tones. Processing is terminated after block 647.

In some example implementations, the histogram technique is used to determine the start and end frequencies of the frequency sweep. In other examples, the histogram bins are used to identify individual frequency tones that are mapped to one or more data bits. In still other examples, the histogram bins are used to identify individual frequency tones that are mapped to individual addresses or commands/data. In still further examples, the histogram bins are evaluated to identify multiple frequency tones that are mapped to combined addresses and commands/data. Many other examples are also considered within the scope of the present disclosure.

The process block diagram and flow chart examples illustrated by FIGS. 6A-6D are merely examples contemplated as applied to this disclosure, and as such, is not limited by the processes presented here.

Figure 6E:
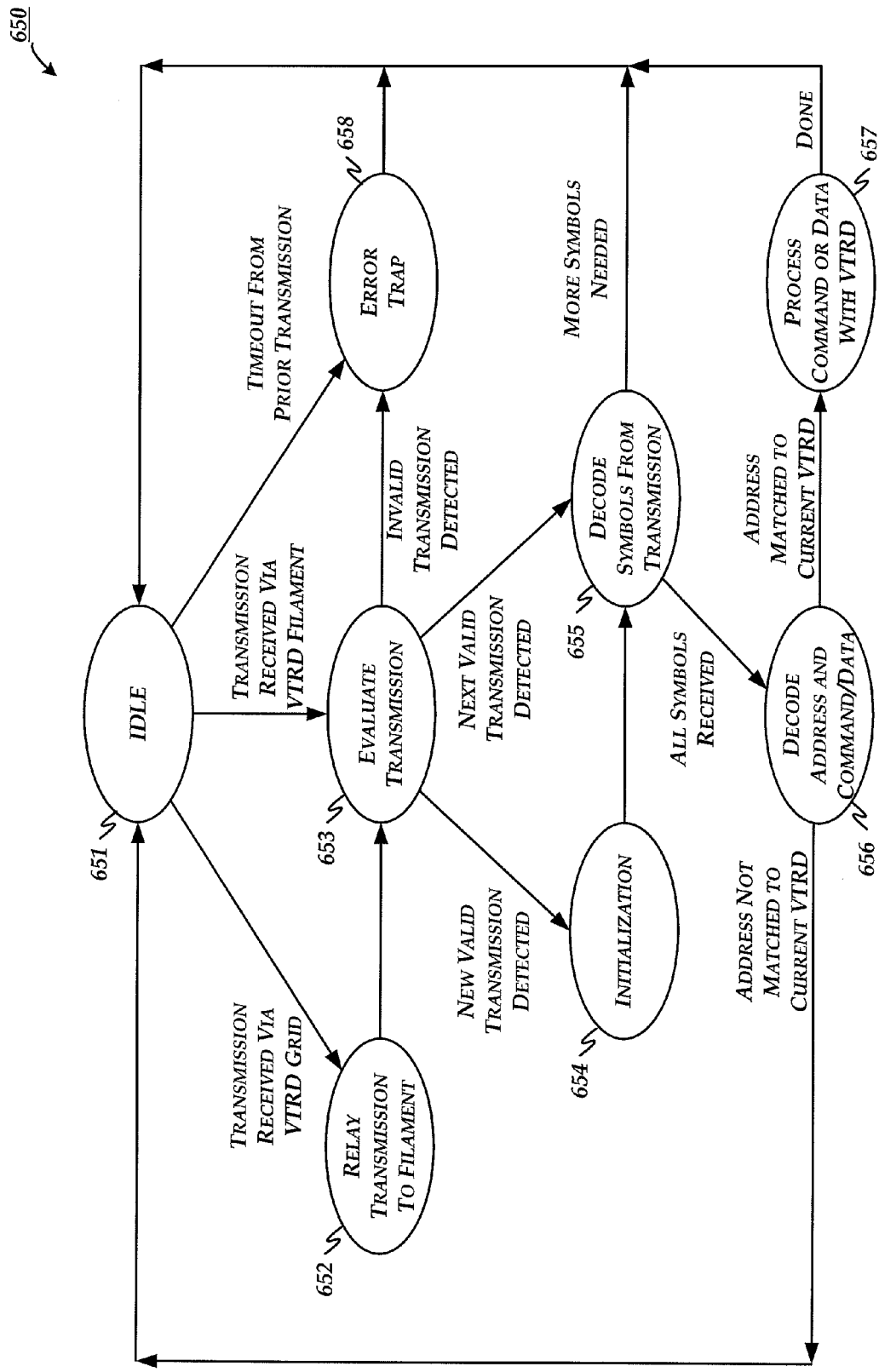
FIG. 6E illustrates an example state diagram for evaluating decoded symbols associated with a VTRD and relaying transmissions over a target amplifier filament power supply system.

FIG. 6E is another processing block diagram (650) associated with processing functions in a VTRD, including an idle block (651), a relay transmission to filament block (652), an evaluate transmission block (653), an initialization block (654), a decode symbols from transmission block (655), a decode address and command/data block (656), a process command or data with VTRD block (657), and an error trap block (658). The processing illustrated in FIG. 6E demonstrates one example system for a VTRD to receive multiple transmissions in a sequence of transmissions. For example, in a simple implementation, one bit of data is transmitted in each transmission burst, where a binary 0 corresponds to one frequency (F1) and a binary 1 corresponds to another frequency (F2). However, other frequency encoding schemes can also be used where each individual transmission can include any number of encoded bits (e.g., 1 bit per transmission, 1.5 bits per transmission, 2 bits per transmission, etc.).

In some examples, it may be necessary to send multiple transmissions to a particular VTRD such as for programming a number of parameters in sequence, once at a time. For example, a DSP processor may be used in a VTRD to add spatial effects such as echo, delay, phasing, chorusing, flanging, reverberation, tremolo, to name a few. The parameters of each special effect may be too numerous to encode in a single transmission, and in this case an extended transmission may be necessary to include all of the data to be communicated.

Processing flows from the idle block (651) to the relay transmission to filament block (652) when transmit energy is detected as received from the grid terminal of the VTRD. The received signals from the grid terminal are transmitted to other VTRDs in a broadcast fashion as will be described in further detail in FIGS. 7 and 8. The relay transmission to filament block (652) transitions to the evaluate transmission block (653). Alternatively, if the transmission is detected as received from the filament supply, then processing flows from the idle block (651) to the evaluate transmission block (653).

At the evaluate transmission block (653), the signal transmission is evaluated using any of the prior described techniques such as single frequency tone analysis, swept frequency analysis, histogram analysis, etc. Processing flows from block 653 to the error trap block (658) when an invalid transmission is detected. Otherwise, processing flows to block 654 when a new valid transmission is detected or to block 655 when a next valid transmission is detected.

Block 654 is an initialization block that is utilized when a valid transmission is detected and no prior sequence has been detected. In this instance, the initialization clears processing registers/buffers so that a first transmission in the sequence can be processed. Processing proceeds from block 654 to block 655, which is arranged to decode symbols from the received transmission and buffer the symbols so that they can be combined with additional symbols from subsequent transmissions. Each symbol may correspond to one or more data bits (e.g., 1 bit, 1.5 bits, 2 bits, 4 bits, . . . ). Processing flows from block 655 to block 656 when a complete sequence of symbols has been received. Otherwise processing flows from block 655 back to the idle block (651) when more symbols are needed to complete the communication with the VTRD.

At block 656, the address and command or data information for the VTRD are decoded from the buffered symbols that were previously captured. Processing flows from block 656 to block 657 when the address of the current VTRD matches the decoded address. Otherwise processing returns to the idle block (651) when the decoded address does not match the current VTRD. At block 657, the decoded command or data is processed by the VTRD (e.g., programming gain, frequency response, special effects, etc.) and processing then returns to the idle block (651) once the command or data is processed.

In some instance, a sequence of transmissions may be interrupted or terminated before all of the necessary symbols are processed. The error trap block (658) can be used to either discard incomplete transmissions, or provide some other error processing when an incomplete transmission is detected. The incomplete transmission can be detected by a timer that is monitored by the idle block (651). After a new valid transmission is detected, and for each sequence of transmissions that follows, the timer can be reset. If the timer reaches some threshold a timeout condition is detected to indicate that a sequence of transmissions was started that did not complete within the requisite time.

Example VTRD with Communication Facility

Figure 7:
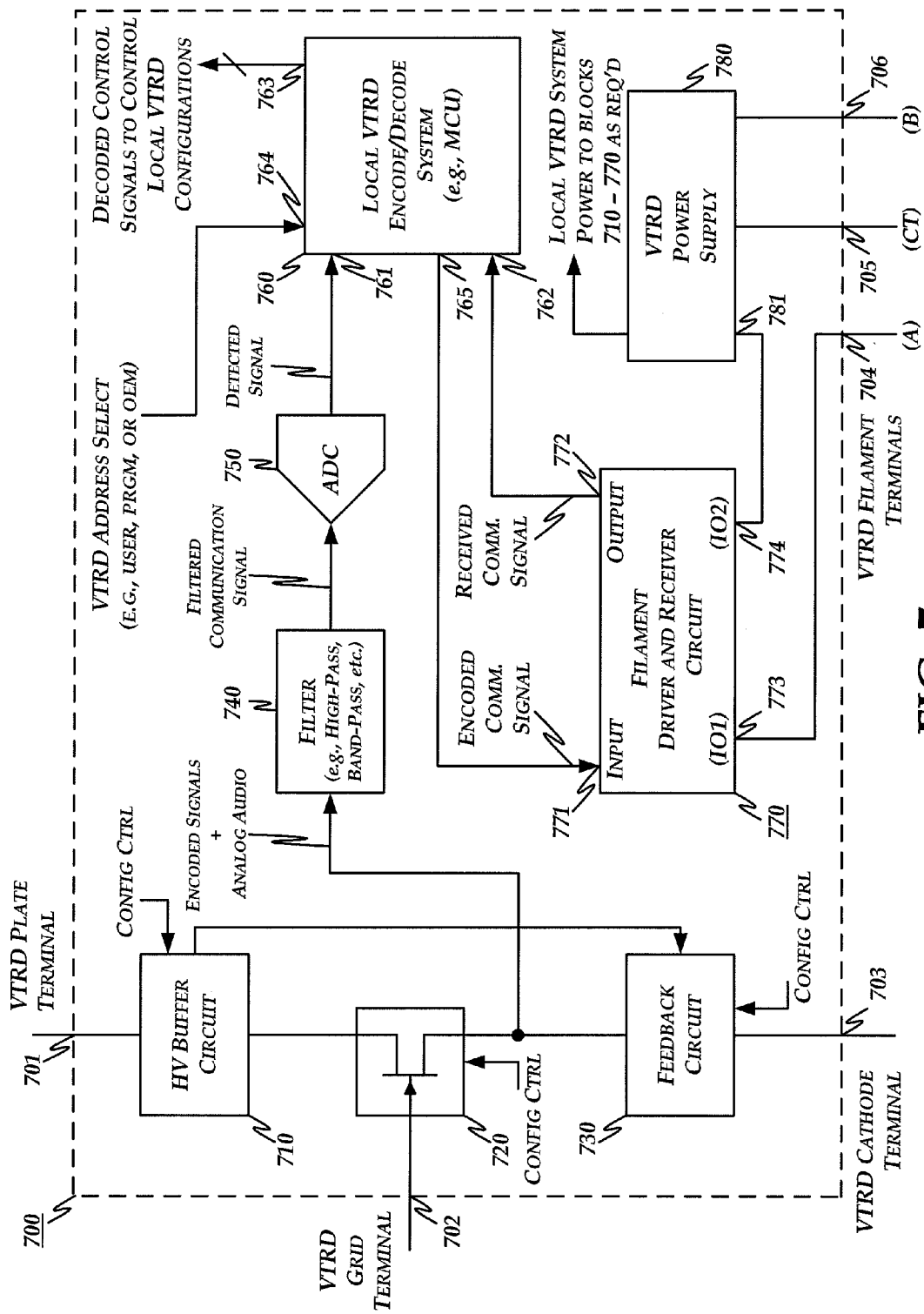
FIG. 7 illustrates and example VTRD system block diagram employing a communication system.

FIG. 7 illustrates an example VTRD system block diagram (700) employing a communication system in accordance with the present disclosure. System block diagram 700 includes a high voltage (HV) buffer circuit (710), a trans-conductance device such as represented by JFET circuit (720), a feedback circuit (730), a filter circuit (740), a analog-to-digital converter (ADC) circuit (750), a local VTRD encode/decode system (760), a filament driver and receiver circuit (770), and a VTRD power supply (780). System block diagram 700 includes a VTRD plate terminal (701), a VTRD grid terminal (702), a VTRD cathode terminal (703), VTRD filament terminal A (704), VTRD filament terminal CT (center-tap) (705), and VTRD filament terminal B (706).

The VTRD grid terminal (702) is coupled to the JFET circuit (720) gate. The JFET circuit (720) drain is coupled to the VTRD plate terminal (701) via the HV buffer circuit (710). The JFET circuit (720) source is coupled to the VTRD cathode terminal via the feedback circuit (730). The HV buffer circuit (710) is coupled to the feedback circuit (730) to allow adjustments in the feedback circuit based on the voltage present at the VTRD plate terminal (701). System blocks 710-730 derive power from the VTRD power supply (780) which isolates and derives power from the target amplifier filament power supply. System blocks 710-730, plus block 780 encompass the basic block diagram for a VTRD. The addition of blocks 740-770 enable the communication function described in the present disclosure.

Under normal operation, the voltage present at the VTRD grid terminal (701) will modulate current through the HV buffer circuit (710) via the JFET circuit (720). The resulting modulated current will be reflected in the VTRD plate load resistor (not shown), which is supplied by the target amplifier topology. The HV buffer circuit isolates the JFET circuit from the high voltages present at the VTRD plate terminal (e.g., +150V to +450V, for example). The feedback circuit (730) makes adjustments to the JFET circuit (720) source voltage based on the VTRD plate voltage, thus establishing a current servo function that enables the VTRD to "self-bias". See U.S. patent application Ser. No. 11/678,562, titled "VACUUM TUBE REPLACEMENT DEVICE, CIRCUIT AND SYSTEM", which was filed Feb. 23, 2007, for a detailed description of VTRD operation.

In order to enhance the functionality of the basic VTRD to include communication capability, the VTRD system block diagram (700) also includes the addition of blocks 740-770.

The source of the JFET circuit (720) is coupled to the input of the filter circuit (740). The output of the filter circuit (740) is coupled to the input of the ADC circuit (750). The output of the comparator circuit (750) is coupled to an input of the local VTRD encode/decode system (760), which receives the detected signal from the ADC circuit (750) at terminal 761 (see FIG. 5, detection threshold 540). The input (771) of the filament driver and receiver circuit (770) is coupled to an output of the local VTRD encode/decode system (760) at terminal 765. The output (772) of the filament driver and receiver circuit (770) is coupled to another input of the local VTRD encode/decode system (760) at terminal 762. The filament driver and receiver circuit (770) includes bi-directional terminals IO1 (773) and IO2 (774). The VTRD filament terminal A (704) is coupled to the IO1 terminal (773) of the filament driver and receiver circuit (770). The IO2 terminal (774) of the filament driver and receiver circuit (770) is coupled to a terminal (781) of the VTRD power supply (780). The address for the VTRD is supplied to an input terminal (764) of the local VTRD encode/decode system (760). An output terminal (763) of the local VTRD encode/decode system (760) is configured to provide decoded control signals for use by the local VTRD functional blocks. The HV Buffer (710), JFET circuit (720), and Feedback circuit (730) include a means for configuration control by the local VTRD encode/decode system (760).

The local VTRD encode/decode system (760) may include any appropriate variety of processor such as, for example, a general purpose micro-processor (MPU), a general purpose micro-controller (MCU), a digital signal processor (DSP), a programmable gate array (PGA), or an application specific integrated circuit (ASIC). In some instances, the processor can be provided as a discrete part; while in other instances the processor can be provided as a core that is integrated into another circuit such as a processor core in a system-on-chip (SOC) circuit. The local VTRD encode/decode system (760) may include firmware that is arranged in cooperation with the processor for program and data storage such as stored in read-only memory (ROM), electrically programmable read-only memory (EPROM), electrically erasable programmable read-only memory (EEPROM), flash programmable read-only memory, battery backed random access memory (RAM), or any other appropriate storage means.

Communication signal energy, such as contemplated to be supplied by the external user interface (audio encode/decode system 110 from FIG. 1), that is established at the VTRD grid terminal (702), is buffered by JFET circuit (720) and coupled to the filter circuit (740). This signal is referred to in the VTRD system block diagram (700) as the encoded signals+ analog audio. The filter circuit (740) removes unwanted audio energy and enhances communication signal energy (e.g., around 200 KHz). Filter circuit (740) may be a high-pass filter, band-pass filter, or a combination of filter types, either passive or active, as may required. The filtered communication signal energy is coupled to the ADC circuit (750), which converts the signal into a digital form. The ADC circuit (750) may be a successive approximation type converter, a sigma-delta (aka delta-sigma) type converter, a comparator, etc. The detected signal is then coupled to an input terminal (761) of the local VTRD encode/decode system (760) terminal for evaluation (see example FIGS. 6A-6E).

The VTRD address may assigned to the VTRD by localized switches on the VTRD, preprogrammed by the factory (original-equipment-manufacturer (OEM)), or programmed by the user, etc. Once the detected signal is decoded by the local VTRD encode/decode system (760), control signals are available to control various VTRD functional blocks as required. Encoded digital signals from the local VTRD encode/decode system (760) can be coupled to the target amplifiers filament power supply wiring via the filament driver and receiver circuit (770). It is considered as part of the scope of this invention that the encoded digital signals sent from local VTRD encode/decode system (760) to the filament driver and receiver circuit (770) may be formed in a digital communication "packet" made up of a series of symbols assembled that are encoded to include an address portion and a command/data portion.

The encoded packet can be encoded using any of the frequency encoding methods described previously above. An optional checksum or parity portion can also be used for error correction purposes. In one example, each packet is 10 bits in length, where 1 data-bit is used for parity, 4 data-bits are utilized for an address (0-15) and 5 data-bits are utilized as a commands or data (0-31).

It is contemplated that local VTRD may communicate its internal information to other communication compatible VTRDs within a target amplifier as well as pass communication data received at the grid terminal from the target amplifiers first input stage VTRD (e.g. via the external user interface or audio encode/decode system described in FIG. 1) to all VTRDs sharing the conventional common filament wiring in the target amplifier. This allows the first input stage VTRD, which has received command/data signals from the external user interface to relay the communication data to other VTRDs in the target amplifier separate from the audio signal path. One advantage of the present embodiment enables communication data to be received by other target amplifier VTRDs even when the target amplifiers volume or tone controls are turned down, since these controls are usually post the-first-input-stage in most target amplifier applications. The filament driver and receiver circuit (770) may also receive signals from the target amplifiers filament power supply wiring and convey the digitized detected signal to the local VTRD encode/decode system (760) via terminal 762. The various functional and/or physical partitions illustrated by FIG. 7 are merely intended to serve as example functional and/or physical partitions, and the various partitions may be separated or integrated into one or more different physical and or functional partitions.

Example VTRD Command Structure

An example command scheme is listed below:

| Code | Brief Description of Command |
| --- | --- |
| 00 | Reset To Default |
| 01-04 | Select Virtual Channel Setting 1-4 |
| 05-12 | Toggle On/Off Signal Processing Effect Setting 1-8 |
| 13 | Select LOW gain |
| 14 | Select MEDIUM gain |
| 15 | Set HIGH gain |
| 16 | Select BOOST gain |
| 17 | Set frequency response FLAT |
| 18 | Toggle BASS BOOST On/Off |
| 19 | Toggle MID BOOST On/Off |
| 20 | Toggle TREBLE BOOST On/Off |
| 21 | Select Next Indicator Mode |
| 22 | Store Program for Next Issued Command |
| 23-29 | Reserved for Additional Functions |
| 30 | Report Current Setting |
| 31 | Execute Diagnostics and Report of All Settings |

Each time a command is sent to the VTRD, an indicator can be provided to give feedback to the user that the command has been processed. For example, an LED in the VTRD may flash on and off one or more times to indicate that the program has been accepted. Command Code=00 can be utilized to reset the VTRD to a default configuration such as medium gain, flat frequency response, all signal processing effects off, etc. Command Codes 01-04 can be used as virtual channel settings in a four channel amplifier configuration, where a set of gain, frequency response and other settings may be retrieved and the VTRD initialized accordingly. Command Codes 05-12 can be used to toggle on and off a signal processing effect such as from a digital signal processor, which can be custom programmed for any number of functions such as echo, delay, chorus, phase shifting, flanging, tremolo, reverb, distortion, and any other appropriate type of DSP effect. Command Codes 13-15 can be used to select low, medium and high gain settings, respectively. Command Code 16 can be used to select a gain boost for the current setting (e.g., a 3-6 dB boost in gain with respect to the currently selected gain setting). Command Code 17 can be arranged to adjust a frequency response for the VTRD to a flat frequency response. Command Codes 18-20 can be used to toggle on/off a boost to frequencies for bass enhancement, middle frequencies enhanced, or treble frequencies enhanced. Command code 21 can be used to advance to the next indicator mode (e.g., LED alerts, audible alerts, See U.S. patent application Ser. No. 11/203,077, titled "INDICATORS FOR VACUUM TUBE REPLACEMENT DEVICES" for example indicators). Command code 22 can be used to issue a command to program the next issued command (if valid). Command 23-29 can be reserved for additional functions. Command code 30 can be used to request a report of the current setting, while command code 31 can be used to request execution of diagnostics and a report of all results and settings.

The programming of various virtual channels and signal processing effects can either be done as a factory selected program, or as a software programmable feature that is communicated to the VTRD by an extended communication message to the VTRD. In one example programming method, a user initially selects a gain setting and frequency response setting as may be desired from any one of command code settings 13-20, in addition to the selection of any signal processing effects from command code settings 05-12. After the user is satisfied with the current settings, the store program code (22) is initiated followed by the user sending one codes 01-04 to select the virtual channel for the programming. For signal processing effects programming, the user can select the store program command code (22), followed by the signal processing effect command code for the signal processing effect to be programmed (05-12). One or more four-bit data-words are then sent to the VTRD (in the command field) with the MSB set to one so that the DSP parameters can be stored. After all of the DSP parameters are stored, an all zeros code can be sent to the VTRD to indicate that programming is complete. The DSP programming can be facilitated with the use of a MIDI controller or personal computer interface as previously described.

Example VTRD Filament Driver/Receiver

Figure 8:
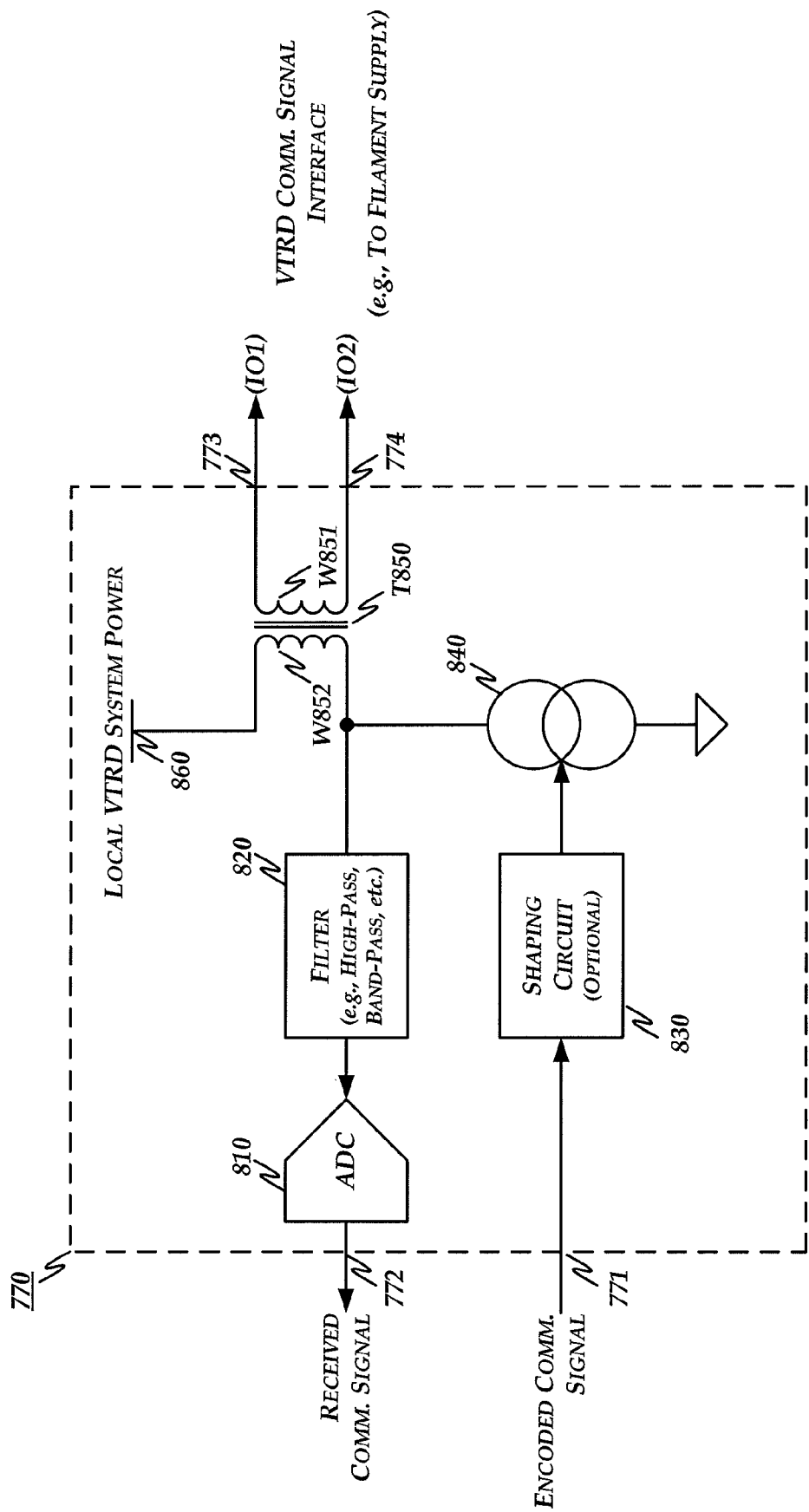
FIG. 8 illustrates the functional and/or physical partitions associated with a filament driver and receiver circuit.

FIG. 8 illustrates example functional and/or physical partitions associated with a filament driver and receiver circuit (770) in a VTRD. The filament driver and receiver circuit (770) includes a analog-to-digital converter (ADC) circuit (810), a filter circuit (820), an optional shaping circuit (830), a programmable current sink (840), a 2 port transformer circuit (T850) which includes windings W851 and W852, and local VTRD system power (860). The filament driver and receiver circuit (770) includes an encoded communication signal terminal (771), a received communication signal terminal (772), and interchangeable/bi-directional VTRD communication signals interface terminals IO1 (773) and IO2

Figure 9:
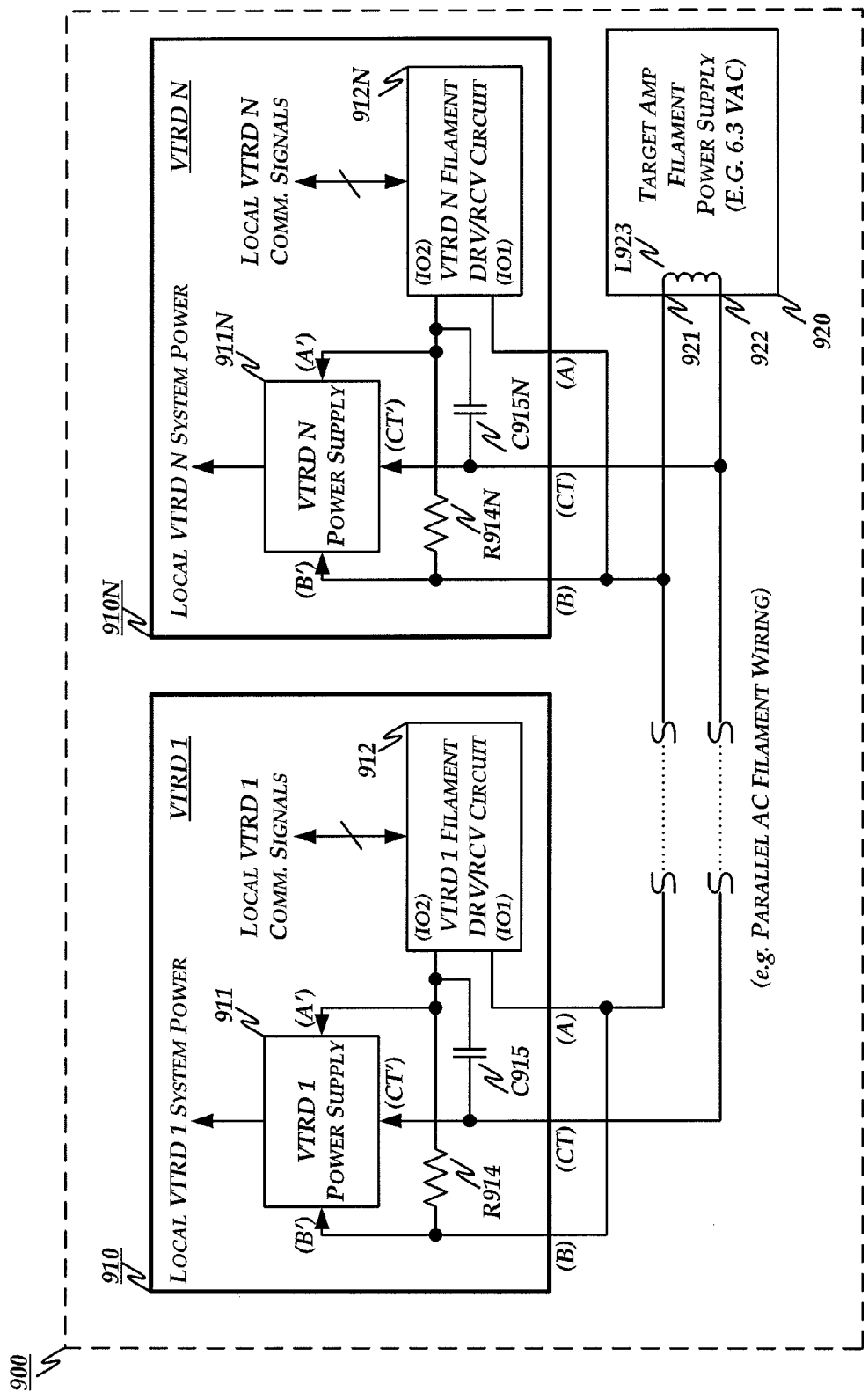
FIG. 9 illustrates an example block diagram utilizing communication compatible VTRD's associated with a target amplifier employing a parallel coupled AC filament supply.
Figure 10:
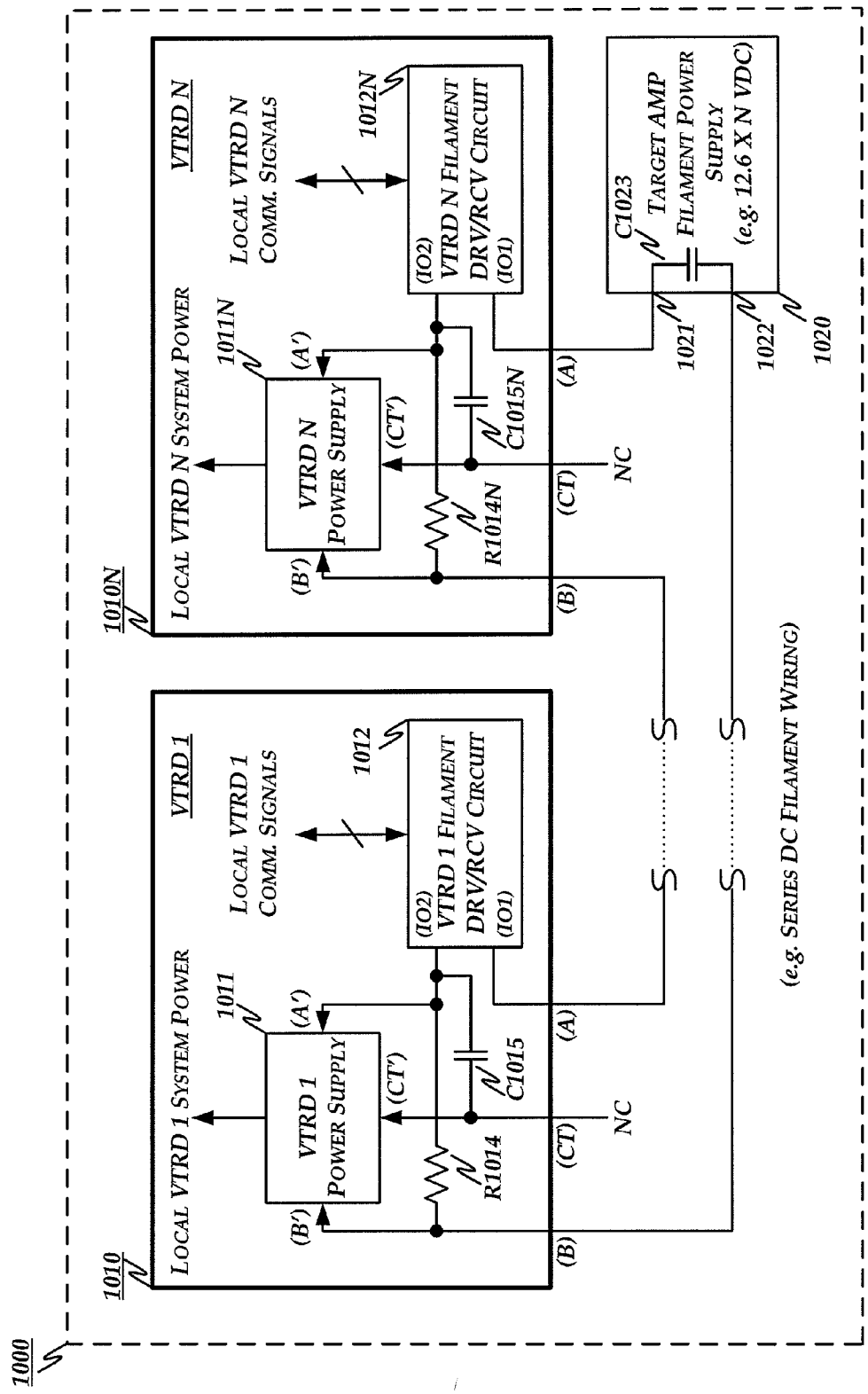
FIG. 10 illustrates an example block diagram utilizing communication compatible VTRD's associated with a target amplifier employing a series coupled DC filament supply.

(774) which are contemplated to be coupled to the target amplifier filament supply, such as described for FIGS. 7, 9, and 10.

The encoded comm. signal terminal (771) is coupled to the input of the shaping circuit (830). The output of the shaping circuit (830) is coupled to the programmable current sink (840), which cooperatively operates as a voltage programmable current sink. The output of the ground referenced current sink is coupled to the transformer circuit (T850) winding W852 and to the input of the filter circuit (820). The remaining side of winding W852 is coupled to the local VTRD system power (860). The output of the filter circuit (820) is coupled to the input of the ADC circuit (810). The output of the ADC circuit (810) is coupled to the received comm. signal terminal (772). The IO1 terminal (773) is coupled to one side of the transformer circuit (T850) winding W851 and the remaining side of winding W851 is coupled to the IO2 terminal (774).

The function of the filament driver and receiver circuit (770) is to couple encoded communication signal energy between the local VTRD encode/decode system (block 760 described previously in FIG. 7) and the target amplifier filament power supply system (wiring). In the present embodiment, while receiving from the filament power supply system, communication signal energy impressed on winding W851 via the target amplifier filament supply is coupled to winding W852 by transformer circuit T850. The communication signal is then filtered via the filter circuit (820), which removes unwanted non-communication signal energy (e.g., noise, audible audio band signals, high frequency signals, etc.) and enhances communication signal energy. Filter circuit (820) may be a high-pass filter, band-pass filter, or a combination of filter types as required. The filtered communication signal energy is coupled to an input of the ADC circuit (810), which converts the signal into a digital form. The ADC circuit (810) may be any reasonable type of converter such as a successive approximation type converter, sigma-delta type converter, comparator, etc. The digital signal from the output of the ADC circuit (810) is then coupled to the local VTRD encode/decode system (block 760 previously) via terminal 772. In some examples, the functions of the ADC circuit (810) and/or the filter circuit (820) can be provided by an MCU or DSP processor that is part of the local VTRD encode/decode system (e.g., 760).

The presently described circuit (770) can be used for transmitting (sending) communication signal energy over the target amplifier filament supply. The signal output from the optional shaping circuit (830) is arranged to modulate current through the transformer circuit (T850) winding W852 via the current sink (840). The encoded communication signal energy is impressed on winding W852 and coupled to winding W851 through the transformer circuit T850 to the target amplifier filament wiring system via terminals 773 and 774. Signals received over the filament wires from terminals 773 and 774 are coupled through the transformer circuit (T850) to the ADC circuit (810) through filter circuit (820). The received communication signals can then be processed by the local VTRD encode/decode system (block 760 previously) via terminal 772.

For examples where digital-type signals are transmitted over the filament wires, the filament driver and receiver circuit (770) can use the shaping circuit (830) to appropriately reduce harmonic generation that may otherwise be present from digital signals containing fast rise and fall edges and/or a discontinuous derivative temporal morphology. Harmonic energy generated without the use of a shaping circuit could potentially radiate into other more sensitive systems in the audio amplifier and produce imaging in the audio band. The shaping circuit (830) may implemented as either an analog or digital system as desired to achieve the appropriate shaping and may include filters, buffers, and other circuit functions. It is contemplated that the shaping circuit (830) may be omitted (i.e., optional) depending on the nature of the signals sent by the local VTRD encode/decode system (block 760 discussed previously), such as would be expected for communication signals as described with reference to FIG. 5.

The various functional and/or physical partitions illustrated by FIG. 8 are merely intended to serve as example functional and/or physical partitions, and the various partitions may be separated or integrated into one or more different physical and or functional partitions. Not every subsystem and circuit may be required in all applications, and thus the elimination of various functional partitions is considered within the scope of the present disclosure.

Example VTRD Communications with Paralleled Filaments

FIG. 9 illustrates an example block diagram (900) utilizing communication compatible VTRD's associated with a target amplifier employing a commonly practiced parallel coupled AC filament supply. The purpose of example block diagram (900) is to demonstrate how communication signal energy from one VTRD is coupled to other VTRDs in a target amplifier via the target amplifiers filament power supply wiring utilizing a parallel coupled arrangement with an AC supply.

The block diagram (900) illustrates an array of VTRDs that include VTRD 1 (910) through VTRD N (910N), and a target amplifier filament power supply (920). Each example VTRD block (VTRD 1/VTRD N) is comprised of a VTRD power supply circuit (911/911N), a filament driver and receiver circuit (912/912N), a resistor circuit (R914/R914N), and a capacitor circuit (C915/C915N). A first input/output terminal (IO1) of each VTRD filament driver and receiver circuit (912/912N) is coupled to a first filament wiring terminal (A). A second input/output terminal (IO2) of each filament driver and receiver circuit (912/912N) is coupled to an input terminal (A') of the corresponding VTRD power supply circuit (911/911N), and a common-node for the resistor circuit (R914/R914N), and the capacitor circuit (C915/C915N). The opposite side of each resistor circuit (R914/R914N) is coupled to a corresponding junction of the filament terminal (B) and another input terminal (B') of the VTRD power supply circuit (911/911N). The opposite side of each capacitor circuit (C915/C915N) is coupled to a corresponding junction of the filament terminal (CT) and still another input terminal (CT') of the VTRD power supply circuit (911/911N).

The local VTRD filament driver and receiver circuits (912/912N) communicate comm. signals within the local VTRD. Each resistor circuit (R914/R914N) is arranged to provide a fixed impedance between the corresponding VTRD filament terminals (A, B), so as to emulate the impedances expected in a traditional vacuum tube between these terminals. The impedance between the input/output terminals (IO1, IO2) of the filament driver and receiver circuits (912/912N) is a low impedance (e.g., ideally 0Ω) at AC filament frequencies (i.e., 60 Hz). The filament terminals (A, B) from each VTRD (910-910N) are coupled together in this example, the aggregate of which, is coupled to terminal 921 on the target amplifier filament AC power supply circuit (920). The filament terminal (CT) from each VTRD (910-910N) is coupled to terminal 922 on the target amplifier filament power supply circuit (920). The target amplifier filament power supply circuit (920) is modeled as an inductor (L923) (e.g., in a typical filament supply AC circuit the filament supply AC signal is supplied by a secondary winding of a transformer that can be represented as an inductor), which has a high impedance at the expected frequency of communications when compared to the impedance across the bi-directional input/output terminals (IO1, IO2) terminals of the filament driver and receiver circuit (912/912N).

The above-described target amplifier filament supply system parallel wiring topology demonstrates that all filament driver and receiver circuits (912/912N) terminals (IO1) are coupled together in common. Communication signal current generated from the filament driver and receiver circuit (912) terminal (102) in VTRD 1 (910) is coupled to the filament driver and receiver circuit (912N) terminal (IO2) in VTRD N (910N) via capacitor circuits C915 and C915N and vice-versa. These capacitor circuits are expected to be very low impedance at the communication signal frequencies (e.g., on the order of 10Ω) and relatively high impedance at the AC line frequency (e.g., on the order of 34 KΩ). The communication signal energy loss through resistor circuits R914/R914N is expected to be low since the impedance ratio of circuits R914 to C914 is expected to be on the order of at least 10:1. Communication signal energy loss via inductor L923 is expected to be low due to the reflected high impedance at the communication frequencies, i.e., minimal loading.

Example VTRD Communications with Series Filaments

FIG. 10 illustrates an example block diagram (1000) utilizing communication compatible VTRD's associated with a target amplifier employing a commonly practiced series coupled DC filament supply. The purpose of example block diagram (1000) is to demonstrate how communication signal energy from one VTRD is coupled to other VTRDs in a target amplifier via the target amplifiers filament power supply wiring utilizing a series coupled arrangement with a DC supply. The following VTRD topology described is substantially the same as that described in FIG. 9.

The block diagram (1000) illustrates an array of VTRDs that include VTRD 1 (1010) through VTRD N (1010N), and a target amplifier filament power supply circuit (1020). Each example VTRD block (VTRD 1/VTRD N) is comprised of a power supply circuit (1011/1101N), a filament driver and receiver circuit (1012/1012N), a resistor circuit (R1014/R1014N), and a capacitor circuit (C1015/C1015N). A first input/output terminal (IO1) of each VTRD filament driver and receiver circuit (1012/1012N) is coupled to a first filament wiring terminal (A). A second input/output terminal (IO2) of the filament driver and receiver circuit (1012/1012N) is coupled to the an input terminal (A') of the corresponding VTRD power supply circuit (1011/1011N), and a common-node for the resistor circuit (R1014/R1014N) and the capacitor circuit (C1015/C1015N). The opposite side of each resistor circuit (R1014/R1014N) is coupled to a corresponding junction of the filament terminal (B) and another input terminal (B') of the VTRD power supply circuit (1011/1011N). The opposite side of each capacitor circuit (C1015/C1015N) is coupled to the filament terminal (CT) and still another input terminal of the VTRD power supply circuit (1011/1011N).

The local VTRD filament driver and receiver circuits (1012/1012N) communicate comm. signals within the local VTRD. Each resistor circuit (R1014/R1014N) is arranged to provide a fixed impedance between the VTRD filament terminals (A, B), so as to emulate the impedances expected in a traditional vacuum tube between these terminals. The impedance between the input/output terminal (IO1, IO2) of the filament driver and receiver circuits (1012/1012N) is a low impedance (e.g., ideally Ω) at AC filament frequencies (i.e., 60 Hz).

The first filament terminal (A) from VTRD 1 (1010) is coupled to the second filament terminal (B) on VTRD N (1010N). The first filament terminal (A) from VTRD N (1010N) is coupled to a first filament terminal (1021) of the target amplifier filament DC power supply circuit (1020). A second filament terminal (1022) of the target amplifier filament DC power supply circuit (1020) is coupled to the second filament terminal (B) of VTRD 1 (1010). The center tap (CT) terminals from each VTRD (1010-1010N) are not connected (NC). The target amplifier filament power supply circuit (1020) is modeled as a capacitor (C1023) (e.g., in a typical filament supply DC circuit the filament supply DC signal is supplied by a rectifier circuit and a supply filter capacitor which can be simply represented as a capacitor), which has a low impedance at the expected frequency of communications.

The above-described target amplifier filament supply system series wiring topology demonstrates that communication signal current generated from the second bi-directional terminal (IO2) of the filament driver and receiver circuit (1012) in VTRD 1 (1010) is coupled to terminal 1022 of the target amplifier filament power supply circuit (1020) via resistor circuit R1014. Since the impedance of capacitor C1023 is expected to be very low at communication signal frequencies, the communication signal current will flow from terminal 1021 of the target amplifier filament supply circuit (1020) and into bi-directional terminal IO1 of the filament driver and receiver circuit (1012N) in VTRD N (1010N). The communication signal current will continue to flow from the second bi-directional terminal (IO2) of the filament driver and receiver circuit (1012N) in VTRD N (1010N) and into the first bi-directional terminal (IO1) of the filament driver and receiver circuit (1012) in VTRD 1 (1010) via resistor circuit R1014N, thus completing the communication signal routing.

Example VTRD Communications with Query/Response Operation

Figure 11:
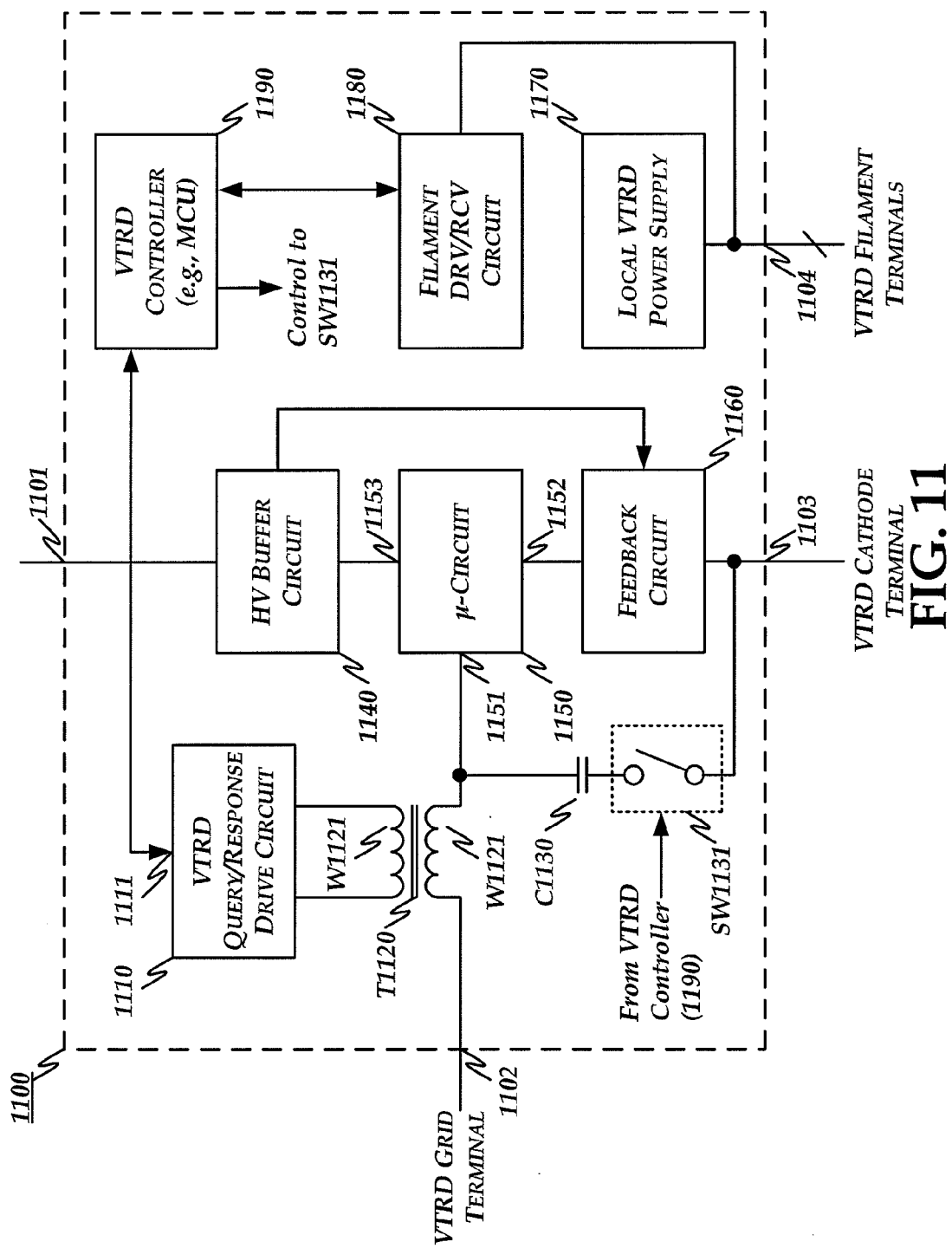
FIG. 11 illustrates the functional and/or physical partitions of an example VTRD employing a communication system which includes a query/response capability.

FIG. 11 illustrates an example VTRD block diagram (1100) employing a communication system which includes a query/response capability. The VTRD block diagram (1100) includes a VTRD query/response drive circuit (1110), a coupling transformer circuit (T1120), a capacitor circuit (C1130), a switch circuit (SW1131), an HV buffer circuit (1140), a trans-conductance ($\mu$) circuit (1150), a feedback circuit (1160) a local VTRD power supply circuit (1170), a filament driver and receiver circuit (1180) and a VTRD controller circuit (1190). The VTRD block diagram (1100) includes a VTRD plate terminal (1101), VTRD grid terminal (1102), VTRD cathode terminal (1103) and VTRD filament terminals (1104).

The VTRD grid terminal (1102) is coupled to a control input (1151) of the trans-conductance or $\mu$-circuit (1150) via the secondary winding (W1121) of the transformer circuit (T1120). Capacitor circuit (C1130) is coupled from the junction of winding W1121 and control input 1151 of the $\mu$-circuit input (1150) to the VTRD cathode terminal (1103) via the switch circuit SW1131. An output terminal (1153) of the $\mu$-circuit (1150) is coupled to the VTRD plate terminal (1101) via the HV buffer circuit (1140). The reference terminal (1152) of the $\mu$-circuit (1150) is coupled to the VTRD cathode terminal (1103) via the feedback circuit (1160). The HV buffer circuit (1140) is also coupled to the feedback circuit (1160) for feedback operation. The VTRD filament terminals (1104) are coupled to the VTRD local power supply circuit (1170) and the filament driver and receiver circuit (1180). The filament driver and receiver circuit (1180) is also coupled to the VTRD controller (1190) to facilitate communication between the local VTRD and a target amplifier filament supply wiring. The VTRD controller (1190) is coupled a bi-directional terminal (1111) of the VTRD query/response drive circuit (1110). The VTRD query/response drive circuit (1110) is coupled to the primary winding W1121 of the transformer circuit (T1120).

The above-described implementation illustrated by FIG. 11 is contemplated for use in a target amplifiers first input stage since this stage is expected to also communicate externally (e.g., to the external user interface) via the target amplifiers instrument input means (e.g., input jack) via VTRD grid terminal 1102. This is a distinguishable requirement of the first input stage VTRD as compared to the remaining VTRDs in a target amplifier application. Thus, this distinct VTRD topology, which includes capacitor circuit (1130) and transformer circuit (T1120) is expected to typically be used in the target amplifier first stage.

For non-query/response operating modes (expected as the normal operating mode), switch circuit SW1131 is operated in an open-circuit position and the VTRD (1100) is able to accept communication signal commands via the VTRD grid terminal (1102). For query/response operating mode, switch circuit SW1131 is operated in a closed-circuit position and capacitor circuit 1130 is coupled to the VTRD cathode terminal (1103) via the switch circuit (SW1131). The capacitor circuit (1130) and the switch circuit (SW1131) together form a selectively coupled low impedance source that is controlled by the VTRD controller circuit (1190).

When a query command is received by the VTRD (1100) that requires a response, the VTRD controller (1190) sends a control signal to close the switch circuit (SW1131) so that capacitor circuit (C1130) is coupled to the VTRD cathode terminal (1103). The switch circuit (SW1131) remains closed until the response data transmission (i.e., back to the external interface via VTRD grid terminal 1102) operation is complete. Once the response transmission is completed the VTRD controller (1190) sends another control signal to opens the switch circuit (SW1131).

In the conditions where a VTRD query/response command has been acknowledged by VTRDs in a target amplifier, the switch circuit (SW1131) is operated in the closed-circuit position so that capacitor circuit (C1130) establishes a low impedance reference to the VTRD cathode terminal (1103) for the transformer circuit (T1120) at communication signal frequencies. Once the capacitor circuit (1150) is coupled to the VTRD cathode terminal (1103) through switch circuit 1131, and the VTRD controller (1190) can operate the VTRD query/response driver circuit (1110) in a form such as described in FIG. 5. The communication signal can then be generated by the VTRD query/response drive circuit (1110) and coupled to the VTRD grid terminal (1102) via the transformer circuit (T1120).

The addition of the selectively coupled low impedance circuit (C1130, SW1131) does not interfere with operation of the remaining VTRDs in the target amplifier since the described operation will typically only be used in the first input stage of the target amplifier. Also, the capacitive loading due to the capacitor circuit (C1130) when SW1131 is closed is expected to be minimal at audio frequencies (via the target amplifier input signal) and is supported by the output impedance dynamics (e.g., low output impedance) of the external user interface system described previously.

The presently described embodiment is one example of a query/response topology associated with a VTRD of which other topologies are also contemplated. The various functional and/or physical partitions illustrated by FIG. 11 are merely intended to serve as example functional and/or physical partitions, and the various partitions may be separated or integrated into one or more different physical and/or functional partitions. Not every subsystem and circuit may be required in all applications, and thus the elimination of various functional partitions is considered within the scope of the present disclosure.

Example standard vacuum tube pin arrangements are illustrated in FIG. 12. Example (1201) illustrates a 9 pin pentode such as an EL84/6BQ5. Example (1202) illustrates a 9 pin dual (twin) triode such as a 12AX7. Example (1203) illustrates a keyed 7 pin pentode in an "octal arrangement" or 7-pin octal, such as an EL34, 6V6, or 6550.

Example preamplifier devices include 12AX7/ECC83/ 7025/5751 style preamplifier vacuum tubes, 12AU7/12BH7/ ECC99/6191/ECC82 style preamplifier vacuum tubes, 12AT7/6201/ECC81 style preamplifier vacuum tubes, 6DJ8/ ECC88/6922/ECC88 style preamplifier vacuum tubes, 12AY7 preamplifier vacuum tubes, 6N1P/6H30/6C45PI type preamplifier vacuum tubes, to name a few. Example data sheets associated with preamplifier vacuum tubes, including pin arrangements, are illustrated in Appendix A.

Example power-amplifier devices include 6BQ5/EL84/ 7189/SV83/6P14P/6P15P style power-amplifier vacuum tubes, 6550/KT88/KT90 style power-amplifier vacuum tubes, 6CA7/EL34 style power-amplifier vacuum tubes, 6L6/ 5881/KT66/7027 style power-amplifier vacuum tubes, and 6V^GTA/7408 style power-amplifier vacuum tubes. Example data sheets associated with power-amplifier vacuum tubes, including pin arrangements, are illustrated in Appendix B.

Although the invention has been described herein by way of example embodiments, variations in the structures and methods described herein may be made without departing from the spirit and scope of the invention. For example, the positioning of the various functions and components may be varied. Individual components and arrangements of components may be substituted as will be appreciated by one skilled in the art having read the instant disclosure. Since many embodiments of the invention can be made without departing from the spirit and scope of the invention, the invention is not limited except as by the appended claims.

What is claimed is:

1. A communication system for encoding and decoding communication signals for use within an audio amplifier equipped with a vacuum tube replacement device (VTRD), wherein the audio amplifier includes an audio input for interfacing with externally supplied audio signals, the system comprising:

an audio processing system that is externally located with respect to the audio amplifier equipped with the VTRD, wherein the audio processing system is arranged to receive an analog audio signal when input to the communication system and provide a processed analog audio signal that has an audio energy located in an audible frequency band;

a code modulator that is externally located with respect to the audio amplifier equipped with the VTRD, wherein the code modulator is arranged to encode an address signal and a command or data signal into an envelope modulated carrier signal, wherein the address signal and the command or data signal are encoded in one or more frequencies associated with a carrier signal that has a carrier signal energy located in a supra-audible frequency band, and wherein the envelope modulated carrier signal corresponds to an envelope modulated version of the carrier signal that has an envelope with an envelope energy located in a sub-audible frequency band; and a mixer that is externally located with respect to the audio amplifier equipped with the VTRD, wherein the mixer is arranged to combine the envelope modulated carrier signal with the processed analog audio signal to generate a combined signal for communication to the VTRD in the audio amplifier, wherein an output of the mixer is coupled to the audio input of the audio amplifier such that the combined signal is coupled into the audio input of the audio amplifier for receipt by the VTRD in the audio amplifier, wherein the audio input of the audio amplifier serves as both a communication port and an audio input port for the VTRD without modifying the audio amplifier.

2. The communication system of claim 1, further comprising an external controller interface that is located externally with respect to the audio amplifier, wherein the external controller interface is arranged in communication with the code modulator such that one of the address signal or the command or data signal is responsive to an externally supplied control signal.

3. The communication system of claim 1, the audio processing system comprising any one of: a buffer, an amplifier, a gain modifier, a frequency response modifier, an analog signal processing function, and a digital signal processing function.

4. The communication system of claim 1, the code modulator comprising a controller, a carrier generator, and a voltage controlled amplifier, wherein a first port of the controller is arranged to couple a first control signal to a control input of the carrier generator so that one or more frequencies of the carrier signal are encoded with the address signal and command or data signal, wherein an output of the carrier generator is arranged to provide the carrier signal to an input of the voltage controlled amplifier, and wherein a second port of the controller is arranged to couple a second control signal to a control input of the voltage controlled amplifier for adjusting the envelope so that an output of the voltage controlled amplifier corresponds to the envelope modulated carrier signal.

5. The communication system of claim 1, wherein the code modulator is further arranged such that the envelope that is generated by the code modulator corresponds to a time-domain windowing function that reduces imaging of harmonic spurs from the carrier signal into the audible frequency band.

6. The communication system of claim 1, wherein the code modulator is further arranged to encode the address signal in a first set of frequencies and the command or data signal in a second set of frequencies, wherein the code modulator is arranged to combine the first set of frequencies and the second set of frequencies into the carrier signal.

7. The communication system of claim 1, wherein the code modulator is further arranged to encode the address signal in a first frequency and the command or data signal in a second frequency, wherein the code modulator is arranged to sweep the carrier signal from the first frequency to the second frequency, and wherein a fundamental and harmonic energy associated with the sweep of the carrier signal is outside of the audible frequency band.

8. The communication system of claim 1, further comprising a code demodulator that is externally located with respect to the audio amplifier, wherein the code demodulator is arranged to decode a communication signal received from the audio input of the audio amplifier.

9. The communication system of claim 1, further comprising a preamplifier stage that is located within the audio amplifier for amplifying the processed analog audio signal received from the audio input, wherein the preamplifier stage is also arranged for decoding the address signal and the command or data signal from the envelope modulated carrier signal received from the audio input.

10. A communication system for encoding and decoding communication signals for use within an audio amplifier, wherein the audio amplifier includes an audio input for interfacing with externally supplied audio signals, the system comprising:
a first pin-for-pin compatible vacuum tube replacement device (VTRD) that is located in a first preamplifier stage of the audio amplifier for amplifying a processed analog audio signal received from the audio input at a grid terminal associated with the first VTRD, wherein the first VTRD includes facility for
decoding an address signal and a command or data signal from an envelope modulated carrier signal received from the grid terminal of the first VTRD,
selectively relaying a communication signal to the filament wires associated with the first VTRD responsive to the envelope modulated carrier signal, and
adjusting operational parameters associated with the command or data signal in the first VTRD when the address signal corresponds to a first address assigned to the first VTRD.

11. The communication system of claim 10, wherein the first VTRD further comprises facility for generating a response transmission for a prior communication received via the grid terminal that included a data-query command encoded in the command signal, and transmitting the response transmission through audio input of the audio amplifier.

12. The communication system of claim 10, further comprising a second pin-for-pin compatible vacuum tube replacement device (VTRD) that is located in a different stage of the audio amplifier from the first preamplifier stage, wherein the second VTRD includes facility for
decoding the address signal and the command or data signal from the communication signal received from the filament wires of the second VTRD, and
adjusting operational parameters associated with the command or data signal in the second VTRD when the address signal corresponds to a second address assigned to the second VTRD.

13. The communication system of claim 11, wherein the second VTRD further comprises facility for
generating a reply message for a prior communication signal received via the filament wires that included a data-query command encoded in the command signal, and
transmitting the reply message through the filament wires to the first VTRD so that the first VTRD can generate a response transmission that is transmitted outside of the audio amplifier via the audio input through the grid terminal of the first VTRD.

14. The communication system of claim 10, wherein the first VTRD is further arranged to evaluate frequencies associated with the carrier signal, decode an address from the evaluated frequencies when in an address range, and decode a command or data from the evaluated frequencies when in a command or data range.

15. The communication system of claim 10, wherein the first VTRD is further arranged to
evaluate frequencies associated with the carrier signal, identify a minimum frequency associated with the carrier signal,
identify a maximum frequency associated with the carrier signal, and
decode an address and a command or data from the identified maximum and minimum frequencies.

16. A pin-for-pin compatible vacuum tube replacement device (VTRD) that is arranged for cooperation in a communication system for encoding and decoding communication signals for use within an audio amplifier, wherein the audio amplifier includes an audio input for interfacing with externally supplied audio signals, the VTRD comprising:
- a local power supply circuit that is arranged to generate a local power supply for circuits in the VTRD from a filament-supply of the audio amplifier, wherein the local power supply includes a first terminal coupled to a first Filament terminal of the VTRD, a second terminal coupled to a second filament terminal of the VTRD, and a third terminal coupled to a center tap filament terminal of the VTR;
- a high-voltage buffer circuit that is coupled to a plate terminal of the VTRD, wherein the high-voltage buffer circuit is arranged to provide a feedback signal;
- a feedback circuit that is coupled to a cathode terminal of the VTRD, wherein the feedback circuit is arranged in cooperation with the high-voltage buffer circuit via the feedback signal;
- a trans-conductance circuit that is arranged in cooperation with the high-voltage buffer circuit and the feedback circuit for amplifying signals received from a grid terminal of the VTRD, wherein the trans-conductance circuit includes an output terminal that is coupled to the plate terminal of the VTRD through the high-voltage buffer circuit, a reference terminal that is coupled to the cathode terminal of the VTRD through the feedback circuit, and a control input terminal that is coupled to the grid terminal of the VTRD;
- a filter circuit includes an input that is coupled to the reference terminal of the trans-conductance circuit, and an output that is arranged to provide a filtered communication signal that is responsive to signals from the input of the filter circuit, wherein the filter circuit is arranged to block audible audio band signals from the filtered communication signal;
- an analog-to-digital converter circuit that is arranged to receive the filtered communication signal and provides a detected signal in response thereto; and
- a controller that is arranged to decode an address signal and a command or data signal from the detected signal, wherein the detected signal is associated with an envelope modulated signal received from the grid terminal of the VTRD, wherein the grid terminal of the VTRD is arranged for receiving either an envelope modulated carrier signal, an audio signal or a combination thereof, wherein the envelope modulated carrier signal corresponds to an envelope modulated version of a carrier signal, wherein an address signal and a command or data signal are encoded in one or more frequencies associated with the carrier signal, wherein the audio signal has a frequency spectrum that is in an audible frequency band, and wherein the envelope modulated carrier signal has a frequency spectrum that is outside of the audible frequency band.

17. The VTRD of claim 16, further comprising:
- a transformer that includes a first winding and a second winding that are magnetically coupled to one another, wherein the first winding of the transformer is coupled between the grid terminal of the VTRD and the control input terminal of the trans-conductance circuit;
- a driver circuit that includes an output that is coupled across the second winding of the transformer, wherein the driver circuit is responsive to a control signal from the controller such that the driver circuit drives a modulated current through the second winding of the transformer such that a second modulated current is generated by the first winding of the transformer, wherein the controller is arranged to encode information in the modulated current for a reply transmission to an external controller through the grid terminal of the VTRD; and
- a selectively coupled low impedance circuit is selectively coupled between the control input terminal of the trans-conductance circuit and the cathode terminal of the VTRD when the controller modulates the current for the reply transmission with the driver circuit and the transformer.

18. The VTRD of claim 16, further comprising a filament driver circuit that is arranged to generate a modulated signal in response to a control signal from the controller, wherein the control signal from the controller is responsive to the detected signal associated with the envelope modulated carrier signal received from grid terminal of the VTRD, and wherein the filament driver circuit is arranged to couple the modulated signal across the first filament terminal and the second filament terminal of the VTRD for communication to other VTRDs through existing filament wiring of the audio amplifier.

19. The VTRD of claim 18, further comprising a resistor circuit that is coupled between a first output of the filament driver circuit and the first filament terminal of the VTRD, a capacitor circuit that is coupled between the first output of the filament driver circuit and the center tap filament terminal of the VTRD, and a second output of the filament driver circuit that is coupled to the second filament terminal of the VTRD.

20. The VTRD of claim 18, the filament driver circuit further comprising:
- a voltage controlled current source that is arranged to modulate a first current in response to the control signal from the controller; and
- a transformer that includes a first winding and a second winding that are magnetically coupled to one another, wherein the first current is coupled to the first winding of the transformer such that the second winding of the transformer modulates a second current in response thereto, wherein the second winding of the transformer is coupled across the first filament terminal and the second filament terminals of the VTRD such that the envelope modulated carrier signal that is received from the grid terminal of the VTRD is relayed to through existing filament wiring of the audio amplifier.

21. A pin-for-pin compatible vacuum tube replacement device (VTRD) that is arranged for cooperation in a communication system for encoding and decoding communication signals for use within an audio amplifier, wherein the audio amplifier includes an audio input for interfacing with externally supplied audio signals, the VTRD comprising:
- a local power supply circuit that is arranged to generate a local power supply for circuits in the VTRD from a filament supply of the audio amplifier, wherein the local power supply includes a first terminal coupled to a first filament terminal of the VTRD, a second terminal coupled to a second filament terminal of the VTRD, and a third terminal coupled to a center tap filament terminal of the VTR;
- a high-voltage buffer circuit that is coupled to a plate terminal of the VTRD, wherein the high-voltage buffer circuit is arranged to provide a feedback signal;
- a feedback circuit that is coupled to a cathode terminal of the VTRD, wherein the feedback circuit is arranged in cooperation with the high-voltage buffer circuit via the feedback signal;

a trans-conductance circuit that is arranged in cooperation with the high-voltage buffer circuit and the feedback circuit for amplifying signals received from a grid terminal of the VTRD, wherein the trans-conductance circuit includes an output terminal that is coupled to the plate terminal of the VTRD through the high-voltage buffer circuit, a reference terminal that is coupled to the cathode terminal of the VTRD through the feedback circuit, and a control input terminal that is coupled to the grid terminal of the VTRD;

a filament receiver circuit that is coupled across a pair of filament terminals for the VTRD, wherein the filament receiver circuit to generate a received communication signal; and a controller that is arranged to decode an address signal and a command or data signal from the received communication signal, wherein the received communication signal is associated with an envelope modulated signal received from the grid terminal of another VTRD and relayed to the pair of filament terminals through existing filament wiring of the audio amplifier, wherein the envelope modulated carrier signal corresponds to an envelope modulated version of a carrier signal, wherein the address signal and the command or data signal are encoded in one or more frequencies associated with the carrier signal, wherein the envelope modulated carrier signal has a frequency spectrum that is outside of an audible frequency band.

22. The VTRD of claim 21, the filament receiver circuit comprising:

a transformer that includes a first winding and a second winding that are magnetically coupled to one another, wherein the first winding is coupled across the pair of filament terminals such that a first current that is coupled to the first winding of the transformer generates a second current with the second winding of the transformer in response thereto a filter circuit that includes an input that is coupled to the second winding of the transformer, and an output that is arranged to provide a filtered communication signal that is responsive to signals from the input of the filter circuit, wherein the filter circuit is arranged to block audible audio band signals from the filtered communication signal; and an analog-to-digital converter circuit that is arranged to receive the filtered communication signal and provides the received communication signal in response thereto.

23. The VTRD of claim 21 further comprising a filament driver circuit that includes an input that is arranged to receive a control signal from the controller, and an output that is coupled to the second winding of the transformer, wherein the filament driver circuit is arranged to generate a response transmission via the transformer that is responsive to a prior received communication relayed from the other VTRD.

24. The VTRD of claim 23, the filament driver circuit comprising a voltage controlled current source that is arranged to couple a modulated current in response to the second winding of the transformer in response to the control signal from the controller.

* * * * *